US011158600B2

(12) United States Patent
Kuo et al.

(10) Patent No.: US 11,158,600 B2
(45) Date of Patent: Oct. 26, 2021

(54) LITHOGRAPHY PROCESS FOR SEMICONDUCTOR PACKAGING AND STRUCTURES RESULTING THEREFROM

(71) Applicant: Taiwan Semiconductor Manufacturing Company, Ltd., Hsinchu (TW)

(72) Inventors: Hung-Jui Kuo, Hsinchu (TW); Ming-Tan Lee, Kaohsiung (TW); Ting-Yang Yu, Hsinchu (TW); Shih-Peng Tai, Xinpu Township (TW); I-Chia Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/459,218

(22) Filed: Jul. 1, 2019

(65) Prior Publication Data
US 2020/0105711 A1 Apr. 2, 2020

Related U.S. Application Data

(60) Provisional application No. 62/738,830, filed on Sep. 28, 2018.

(51) Int. Cl.
*G06F 17/00* (2019.01)
*H01L 21/768* (2006.01)
(Continued)

(52) U.S. Cl.
CPC ............ *H01L 24/82* (2013.01); *H01L 21/561* (2013.01); *H01L 24/24* (2013.01); *H01L 25/105* (2013.01);
(Continued)

(58) Field of Classification Search
CPC .......... G03F 7/70475; G03F 1/00; G03F 1/42; G03F 7/70633; G03F 9/708; H01L 21/56;
(Continued)

(56) References Cited

U.S. PATENT DOCUMENTS 5,364,718 A 11/1994 Oae et al.
6,077,756 A * 6/2000 Lin .................. H01L 22/34
257/797
(Continued)

FOREIGN PATENT DOCUMENTS

| CN | 106997153 A | 8/2017 |
|---|---|---|
| CN | 107134437 A | 9/2017 |

(Continued)

*Primary Examiner* — Brian Turner
(74) *Attorney, Agent, or Firm* — Slater Matsil, LLP

(57) ABSTRACT

A device includes a molding compound encapsulating a first integrated circuit die and a second integrated circuit die; a dielectric layer over the molding compound, the first integrated circuit die, and the second integrated circuit die; and a metallization pattern over the dielectric layer and electrically connecting the first integrated circuit die to the second integrated circuit die. The metallization pattern comprises a plurality of conductive lines. Each of the plurality of conductive lines extends continuously from a first region of the metallization pattern through a second region of the metallization pattern to a third region of the metallization pattern; and has a same type of manufacturing anomaly in the second region of the metallization pattern.

18 Claims, 35 Drawing Sheets

(51) Int. Cl.
   *G03F 7/20* (2006.01)
   *G03F 1/72* (2012.01)
   *H01L 23/00* (2006.01)
   *H01L 21/56* (2006.01)
   *H01L 25/10* (2006.01)

(52) U.S. Cl.
   CPC ............... *H01L 2224/24011* (2013.01); *H01L 2224/24137* (2013.01); *H01L 2224/25171* (2013.01); *H01L 2224/821* (2013.01); *H01L 2224/8213* (2013.01); *H01L 2224/82132* (2013.01); *H01L 2225/1035* (2013.01); *H01L 2225/1058* (2013.01)

(58) Field of Classification Search
   CPC .................. H01L 23/544; H01L 21/486; H01L 23/49827
   See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2009/0217224 A1* | 8/2009 | Wiaux | G03F 7/70475 716/106 |
| 2011/0245128 A1* | 10/2011 | Kang | G03F 7/425 510/176 |
| 2015/0192823 A1* | 7/2015 | Fu | G02F 1/133308 216/23 |
| 2016/0313601 A1* | 10/2016 | Nam et al. | G02F 1/133512 |
| 2017/0186705 A1* | 6/2017 | Malatkar | H05K 1/02 |
| 2017/0213798 A1* | 7/2017 | Wei | H01L 24/00 |
| 2017/0250138 A1 | 8/2017 | Hsieh et al. | |
| 2018/0122774 A1 | 5/2018 | Huang et al. | |
| 2019/0088602 A1* | 3/2019 | Ogawa | G03F 7/70475 |

FOREIGN PATENT DOCUMENTS

| | | |
|---|---|---|
| JP | 20070171451 A | 7/2007 |
| KR | 20110112181 A | 10/2011 |
| KR | 20180048249 A | 5/2018 |

* cited by examiner

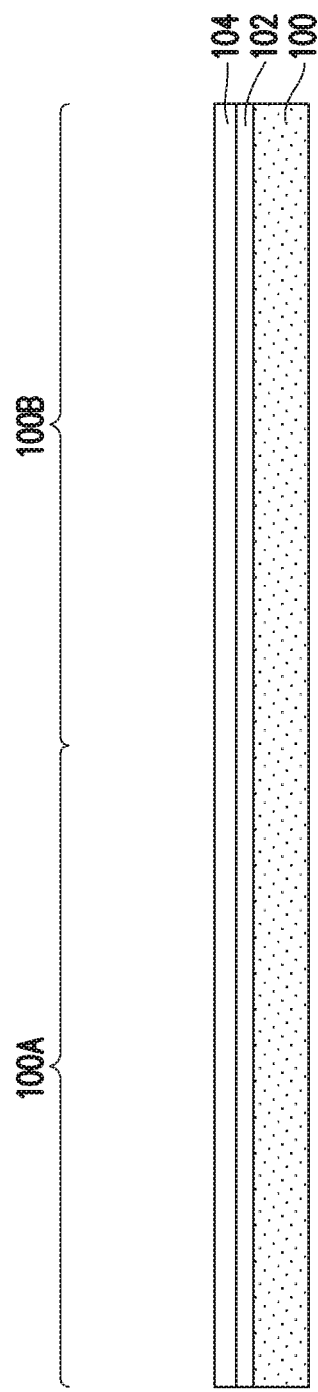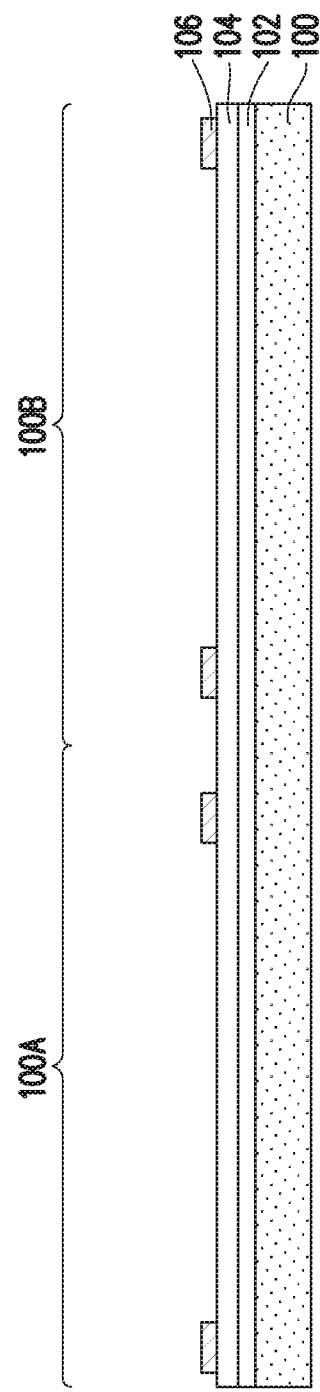

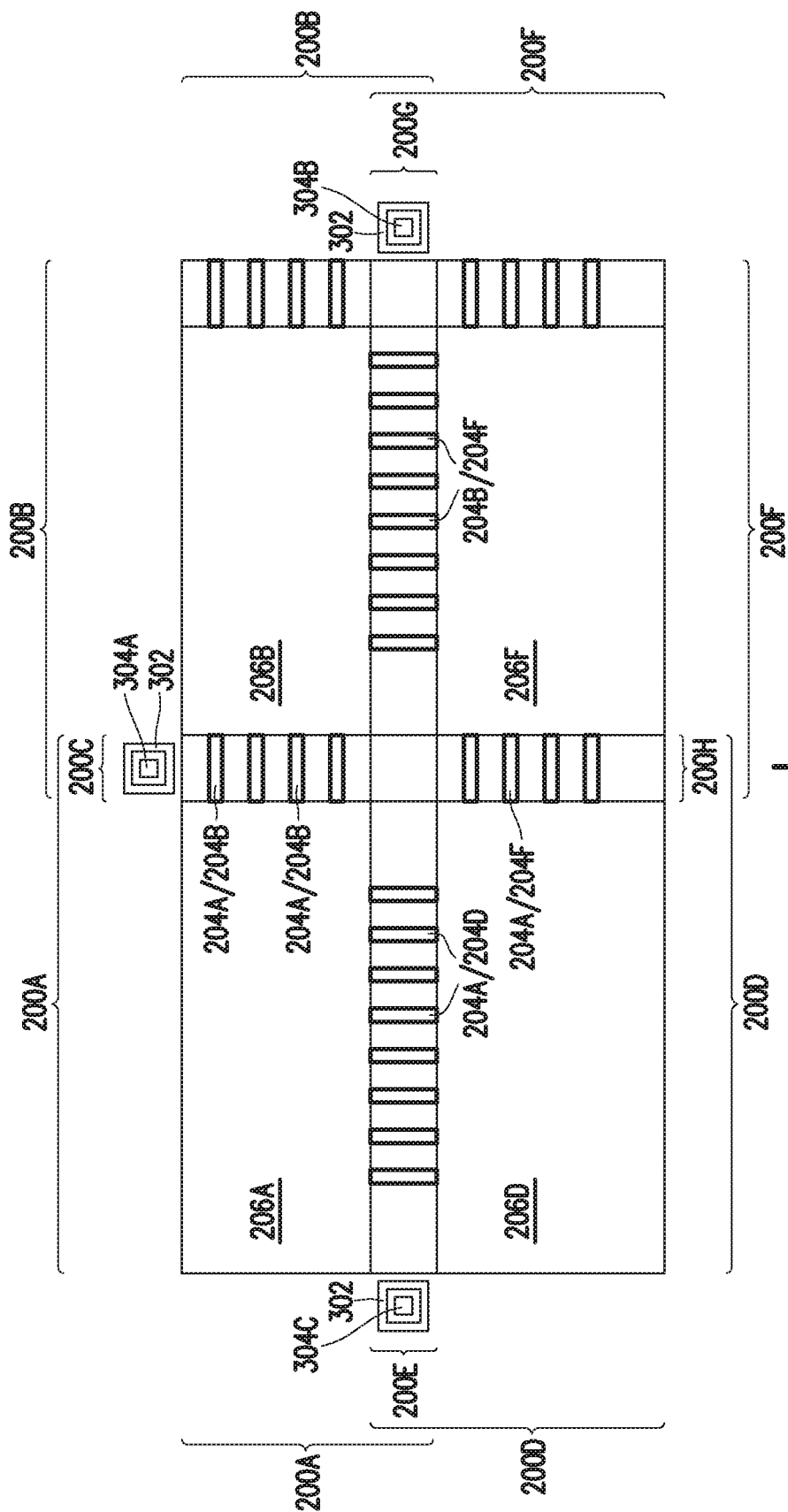

LITHOGRAPHY PROCESS FOR SEMICONDUCTOR PACKAGING AND STRUCTURES RESULTING THEREFROM

PRIORITY CLAIM AND CROSS-REFERENCE

This application claims the benefit of U.S. Provisional Application No. 62/738,830, filed on Sep. 28, 2018 and entitled "Lithography Process for Semiconductor Packaging and Structures Resulting Therefrom," which application is incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-3, 4A, 4B, 5-10, 11A, 11B, 11C, 12A, 12B, and 12C illustrate varying views of intermediary steps of manufacturing a semiconductor package according to various embodiments.

FIGS. 13A, 13B, 13C, 13D, 14A, 14B, 15, 16A, 16B, 16C, 16D, 16E, 16F, and 17-27 illustrate varying views of intermediary steps of manufacturing a semiconductor package according to various embodiments.

DETAILED DESCRIPTION

Figure 3:
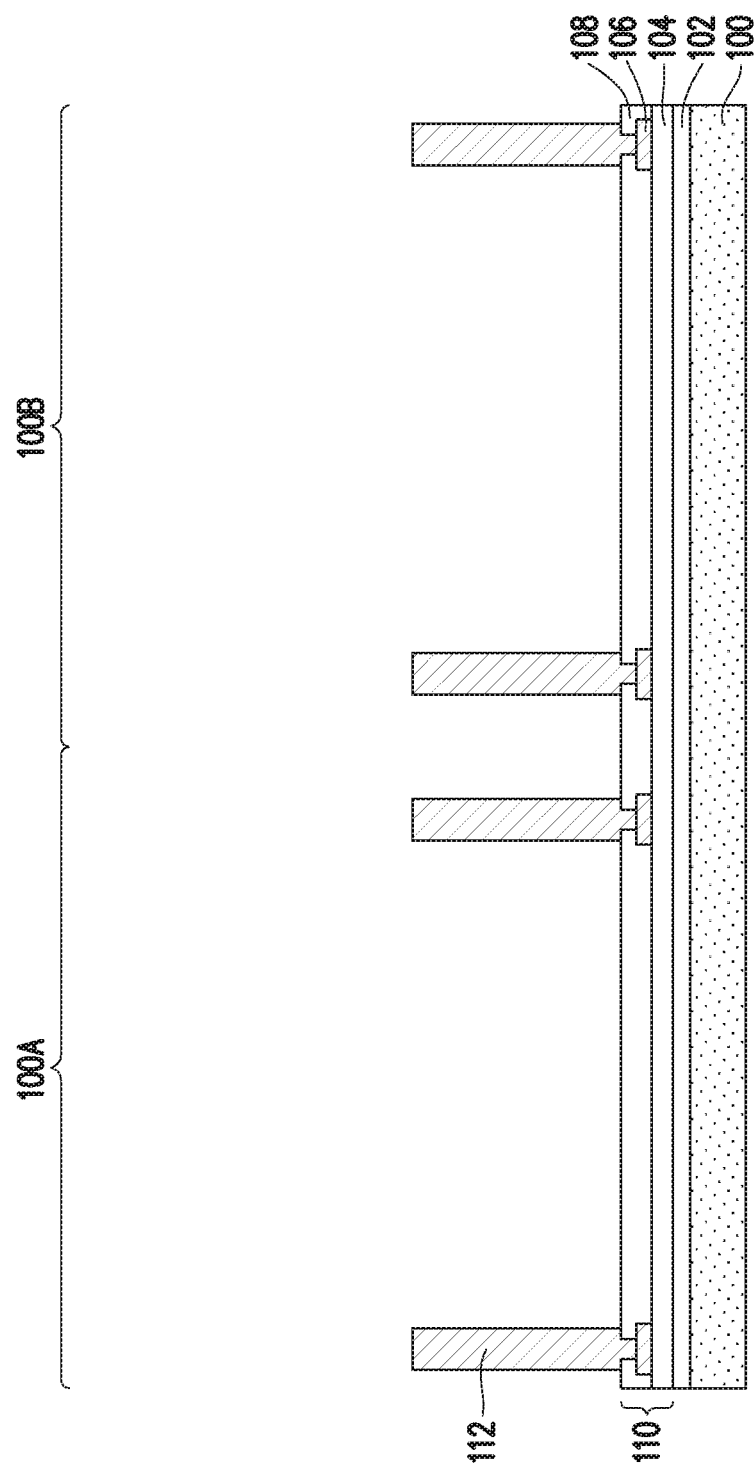

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described below as being directed towards integrated fan-out (InFO) lithography processes. However, it should be understood that the various embodiment methods and resulting structures described herein could be applied to any type of semiconductor package including, for example, a chip on wafer on substrate (CoWoS) package, a fan-in package, or the like.

Various embodiments provide a stitching lithography process for large integrated chip packages to achieve a multi-functional system. Embodiment stitching lithograph processes are not limited by an exposure field size of a lithography stepper. From a top down perspective, the field size of the lithography stepper depends on photo lens dimensions. For example, the resulting pattern from a photo resist mask achievable using a single exposure step is limited by photo lens diameter and is often further limited by its placement on an optical axis to reduce optical aberration. Further, the pattern-edge of a mask is often spaced apart from the physical edge of a photo lens to avoid image distortion. This further limits the size of a pattern achievable using a single exposure step.

For large field-size integration, the desired pattern size of layer is often large, and increasing photo lens size to accommodate the desired pattern size is costly and may be impractical. Embodiment stitching lithography processes employ multiple exposure steps with multiple photomask reticles to define large field-size integration patterns without requiring an increase in photo lens size. For example, a layer is exposed to a first pattern in a first patterning region of the layer using a first photomask reticle, and the layer is exposed to a second pattern in a second patterning region of the layer using a second photomask reticle. The first and second patterning regions of the layer overlap, which allows the first pattern and the second pattern to be interconnected and define an overall desired pattern that is stitched together and extends throughout the first and second patterning regions. An area where the first and second patterning regions overlap may be referred to as a stitching region. A shape (e.g., triangular) of the pattern during each exposure step within the stitching region (e.g., referred to as grey tone patterns) may be adapted to reduce patterning defects resulting from, for example, over exposure caused by the multiple exposure steps performed on the stitching region.

Further, embodiments may use a low numerical aperture (NA) stepper to reduce stitching error because of the relatively large depth of field (DoF) associated with a low NA stepper compared to a high NA stepper. A low NA stepper can be used on large critical dimension (CD) applications, and has an additional benefit of reduced cost compared to a high NA stepper.

By using stitching lithography, field integration size is no longer limited by exposure field size (e.g., the size of each photo lens). For example, the size of a pattern in a layer can be enlarged by stitching different patterns of masks within different stitching regions. Further using gray tone patterns and a low NA stepper could increase tolerance at the stitching region and reduce manufacturing defects at the stitching region.

Various embodiments may achieve one or more of the following non-limiting advantages/features: large field size of semiconductor packages achieved by stitching different mask patterns at stitching regions where the interconnects cross over the stitching region; enlarge package size along one direction if the alignment mark of previous process are placed outside of the field; enlarged package size without boundary if the alignment mark is placed within the field; grey tone patterns and low NA stepper to control the critical dimensions (CD) of interconnects at stitching region with higher tolerance; lower cost; and high yield.

FIGS. 1 through 27 illustrate cross-sectional views of intermediate steps during a process for forming a first package structure in accordance with some embodiments (e.g., to form a component of an InFO package). FIG. 1 illustrates a carrier substrate 100 and a release layer 102 formed on the carrier substrate 100. A first package region 100A and a second package region 100B for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of planarity.

In FIG. 2, a dielectric layer 104 and a metallization pattern 106 are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. One or more exposure steps may be applied to the photo resist to define the metallization pattern 106. After the one or more exposures, the photo resist is developed to form openings through the photo resist to expose the seed layer. Embodiment stitching lithography processes (e.g., as discussed with respect to FIGS. 10 through 16F) may be employed to define the metallization pattern 106. Alternatively, multiple exposure steps may be used to define the metallization pattern 106, with each exposure step defining a separate pattern that is not interconnected, for example, at any stitching regions.

A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

In FIG. 3, an optional dielectric layer 108 is formed on the metallization pattern 106 and the dielectric layer 104. In some embodiments, the dielectric layer 108 is formed of a similar material and using similar methods as the dielectric layer 106. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. As illustrated, the back-side redistribution structure 110 includes the two dielectric layers 104 and 108 and one metallization pattern 106. In other embodiments, the back-side redistribution structure 110 can include any number of dielectric layers, metallization patterns, and vias. One or more additional metallization pattern and dielectric layer may be formed in the back-side redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns. In other embodiments, the back-side redistribution structure 110 may be omitted in its entirety such that subsequently described features are formed directly on the release layer 102.

Further in FIG. 3, through vias 112 are formed. As an example to form the through vias 112, an optional seed layer is formed over the back-side redistribution structure 110, e.g., the dielectric layer 108 and the exposed portions of the metallization pattern 106. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to the through vias 112. One or more exposure steps may be applied to the photo resist to define the through vias 112. After the one or more exposures, the photo resist is developed to form openings through the photo resist to expose the seed layer.

A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112. Alternatively, in embodiments where the dielectric layer 108 is omitted (see e.g., FIG. 4B), the seed layer may also be omitted, and the metallization pattern 106 may be used as a seed layer to plate the through vias 112. For example, in such embodiments, the through vias 112 may be plated directly on the metallization pattern 106.

Figure 4A:
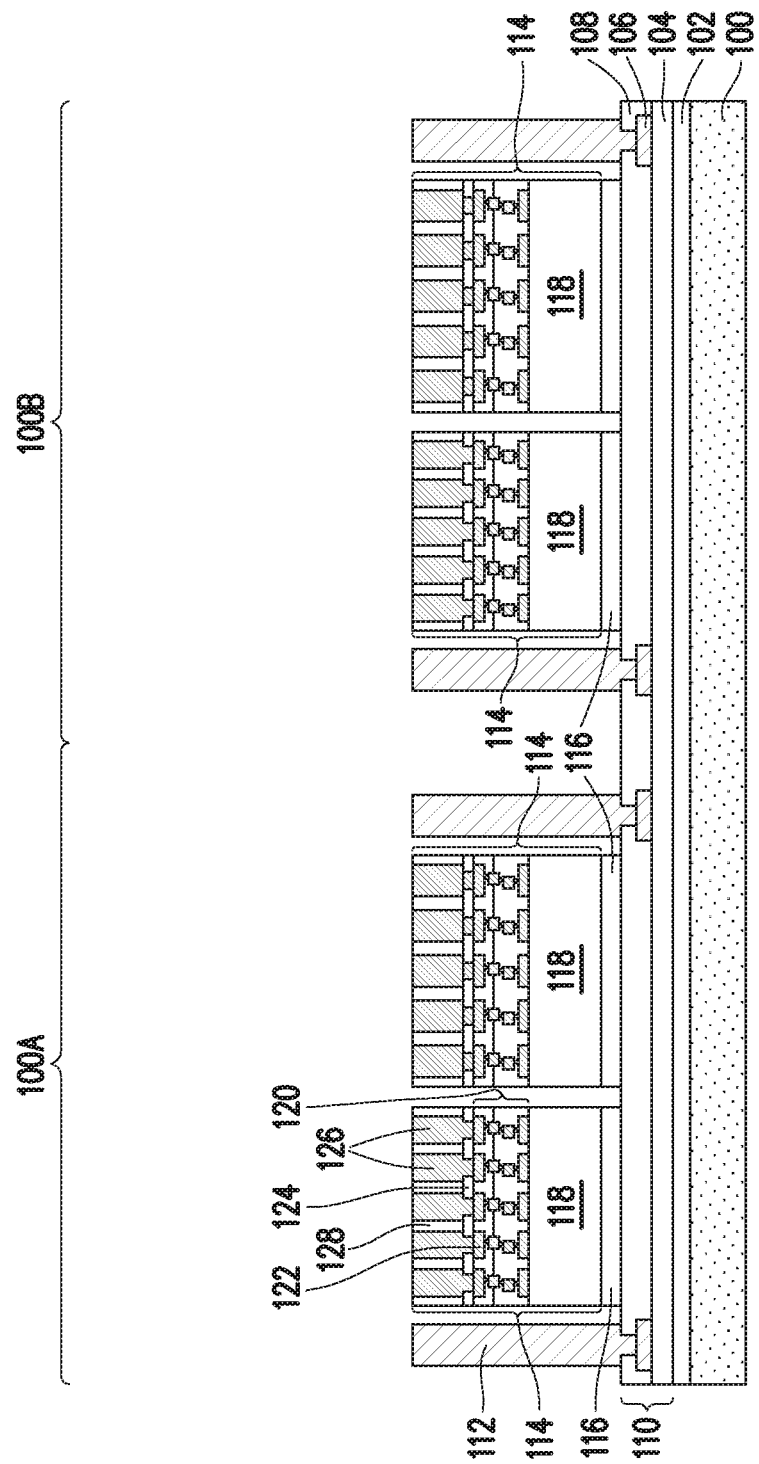

In FIG. 4A, integrated circuit dies 114 are adhered to the dielectric layer 108 by an adhesive 116. As illustrated in FIG. 4A, two integrated circuit dies 114 are adhered in each of the first package region 600 and the second package region 602, and in other embodiments, more or less integrated circuit dies 114 may be adhered in each region. For example, in an embodiment, only one integrated circuit die 114 may be adhered in each region or three or more integrated circuit dies 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the carrier 100, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), extend through the passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Figure 4B:
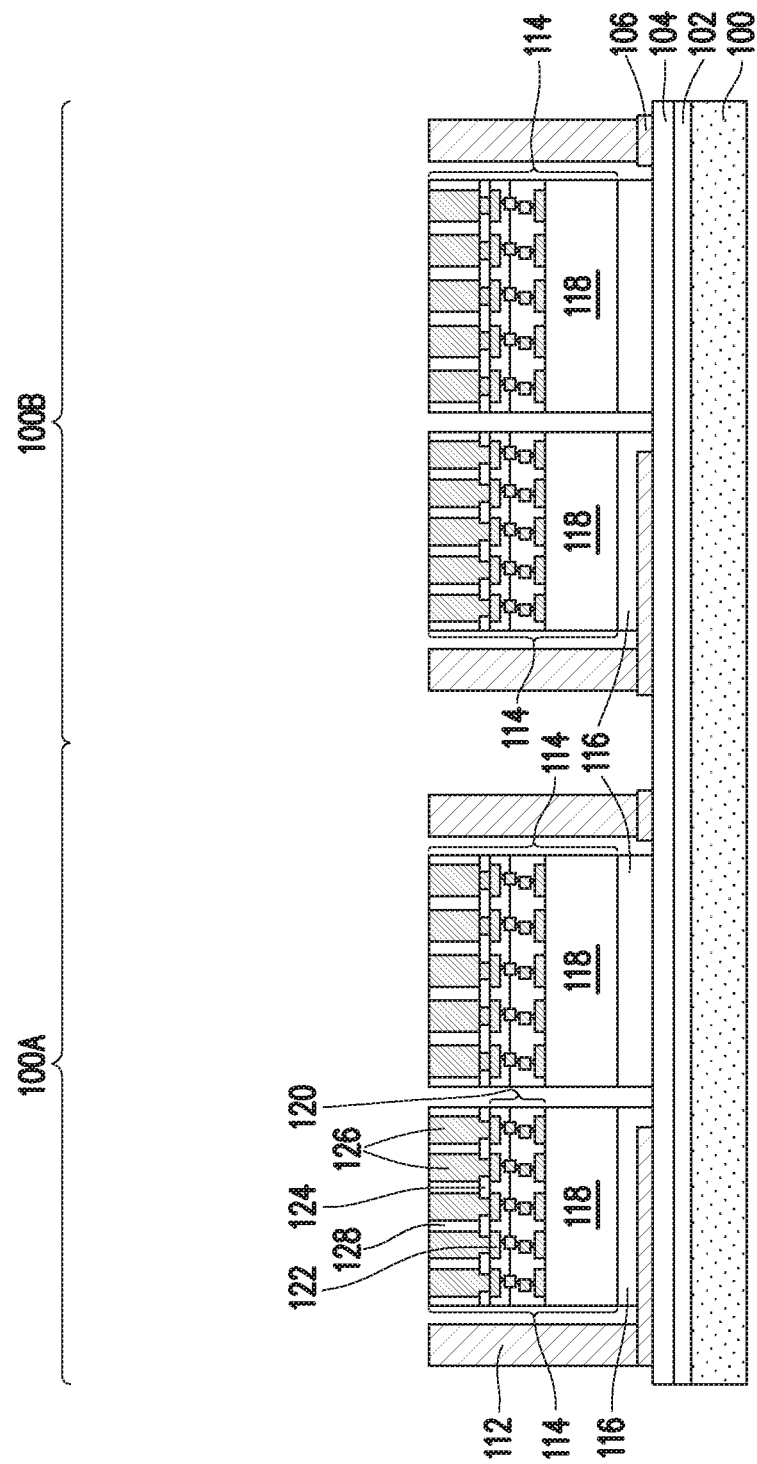

Adhesive 116 is on back-sides of the integrated circuit dies 114 and adheres the integrated circuit dies 114 to the back-side redistribution structure 110, such as the dielectric layer 108 in FIG. 4A. Alternatively, in embodiments where the dielectric layer 108 is omitted, the adhesive 116 may adhere the integrated circuit dies to the metallization pattern 106 and the dielectric layer 104, such as illustrated in FIG. 4B. In such embodiments, the adhesive 116 may extend along a top surface and sidewalls of the metallization pattern 106. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the back-side redistribution structure 110 by the adhesive 116 using, for example, a pick-and-place tool.

Figure 5:
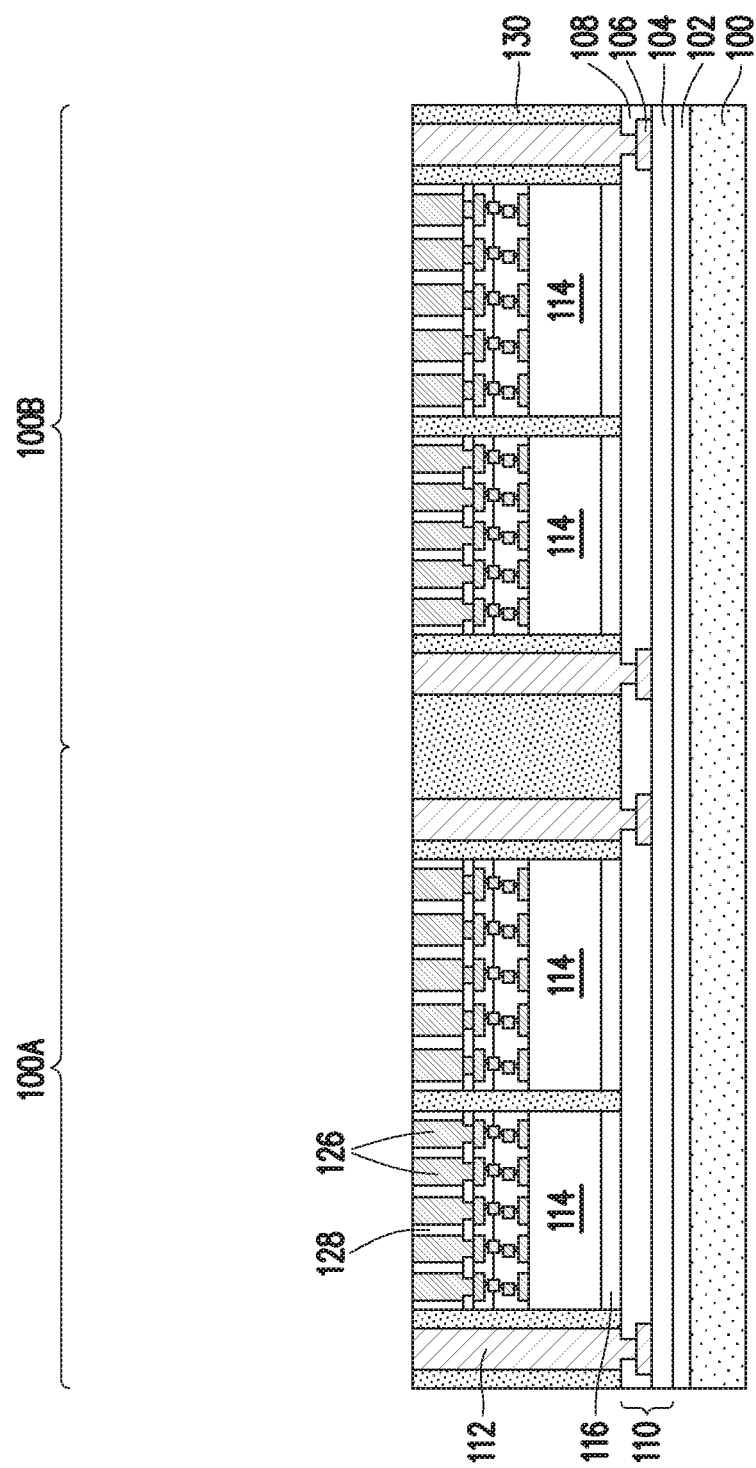

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are coplanar after the grinding process. In some embodiments, the grinding may be omitted, for example, if through vias 112 and die connectors 126 are already exposed.

In FIGS. 6 through 21, a front-side redistribution structure 160 is formed. As will be illustrated in FIG. 21, the front-side redistribution structure 160 includes dielectric layers 132, 140, 148, and 156 and metallization patterns 138, 146, and 154.

Figure 6:
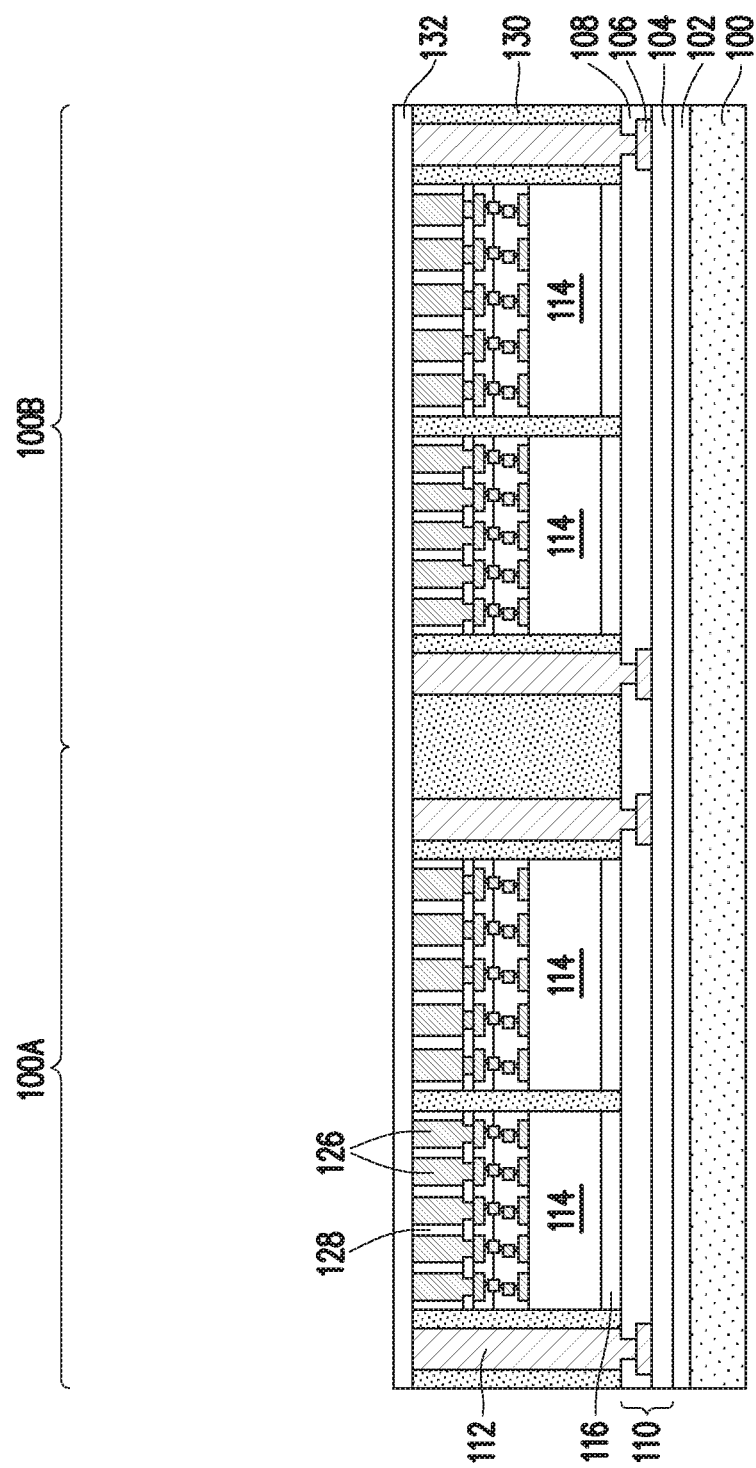

In FIG. 6, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 7:
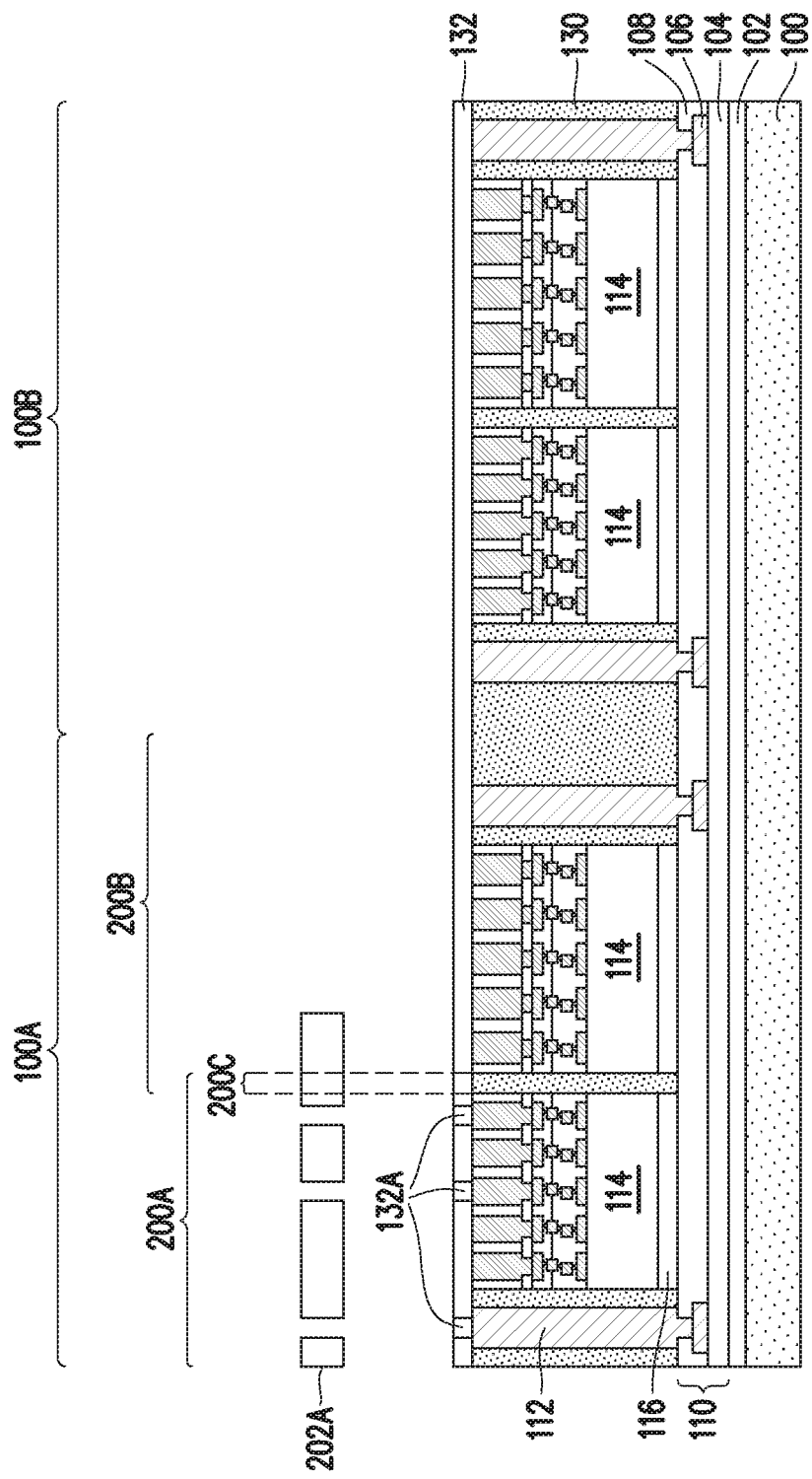
Figure 8:
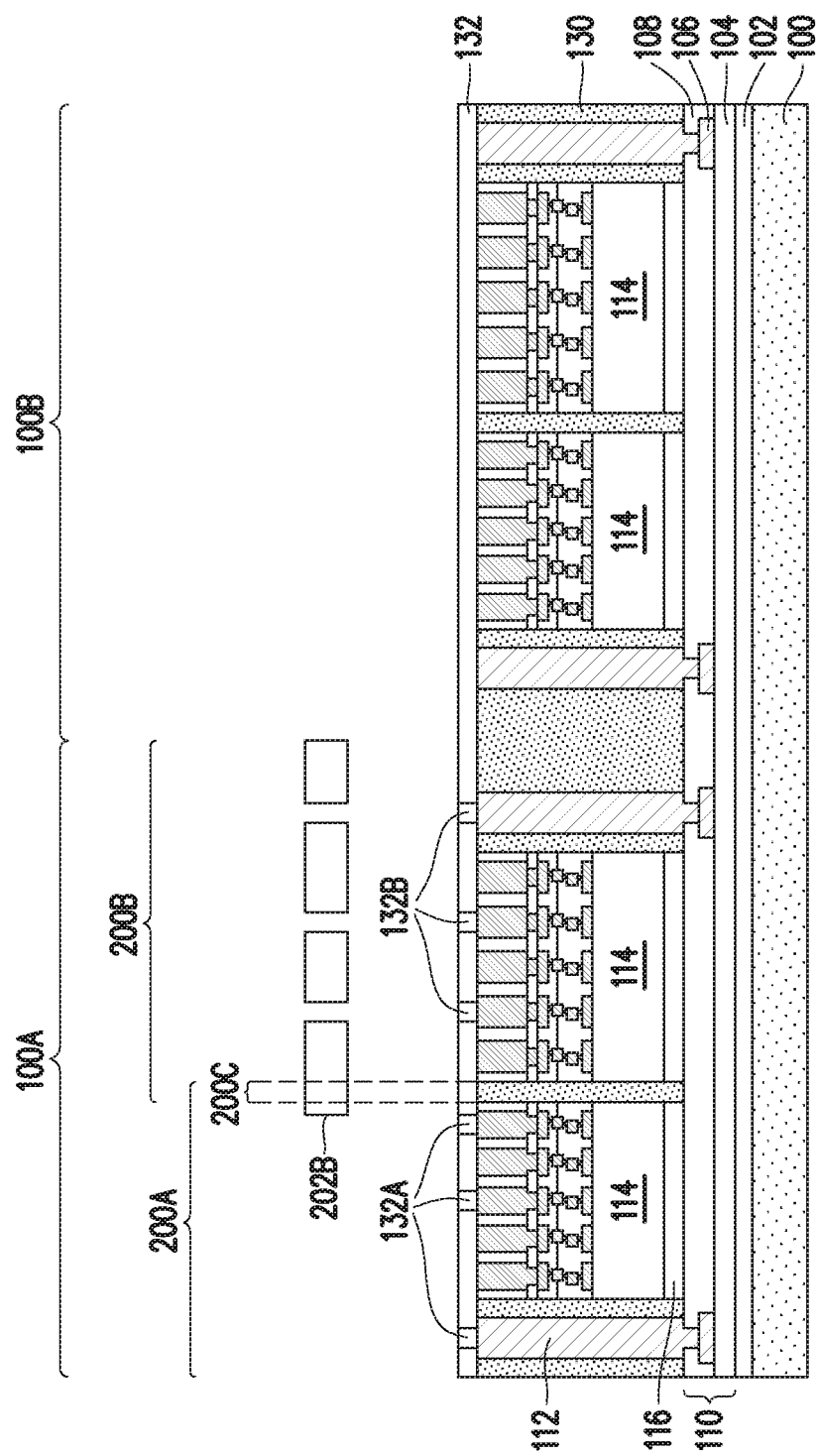
Figure 9:
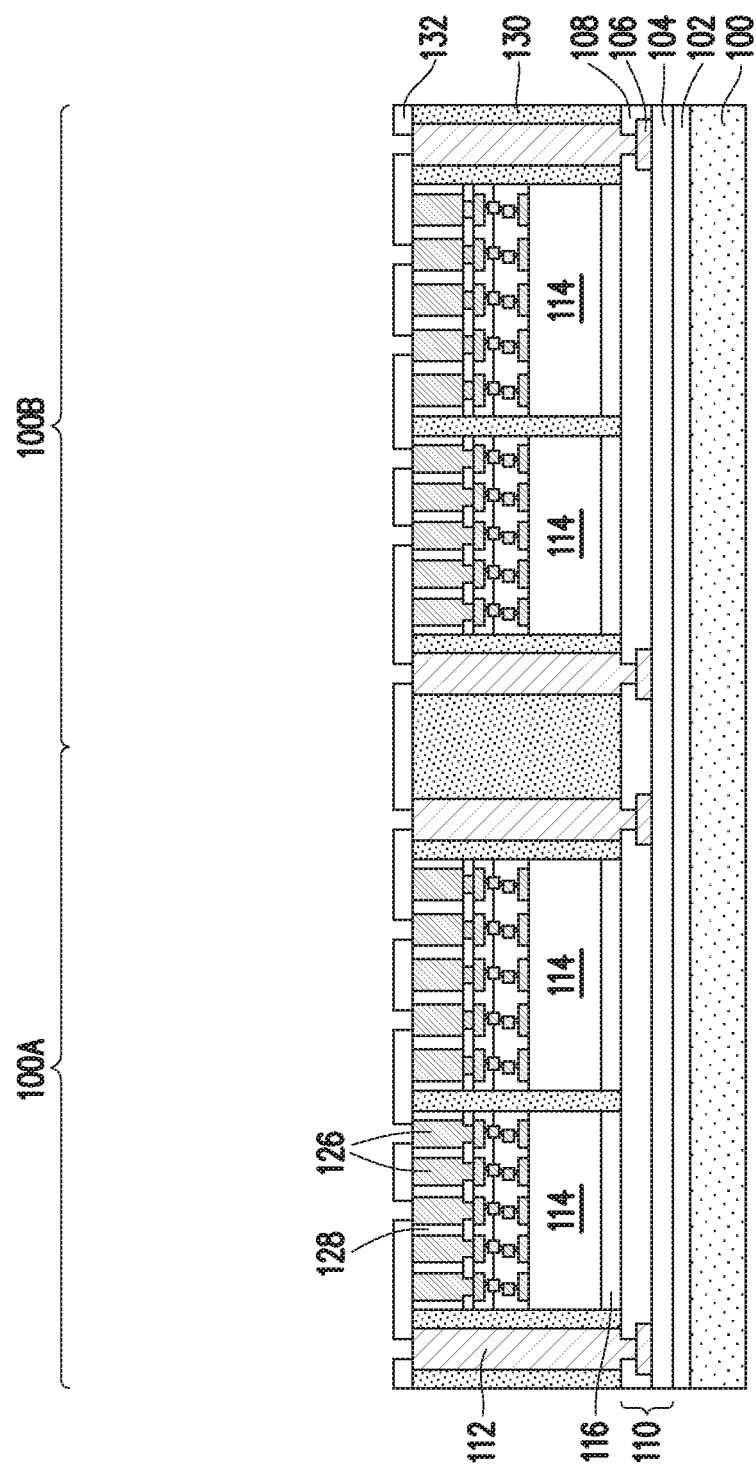
Figure 10:
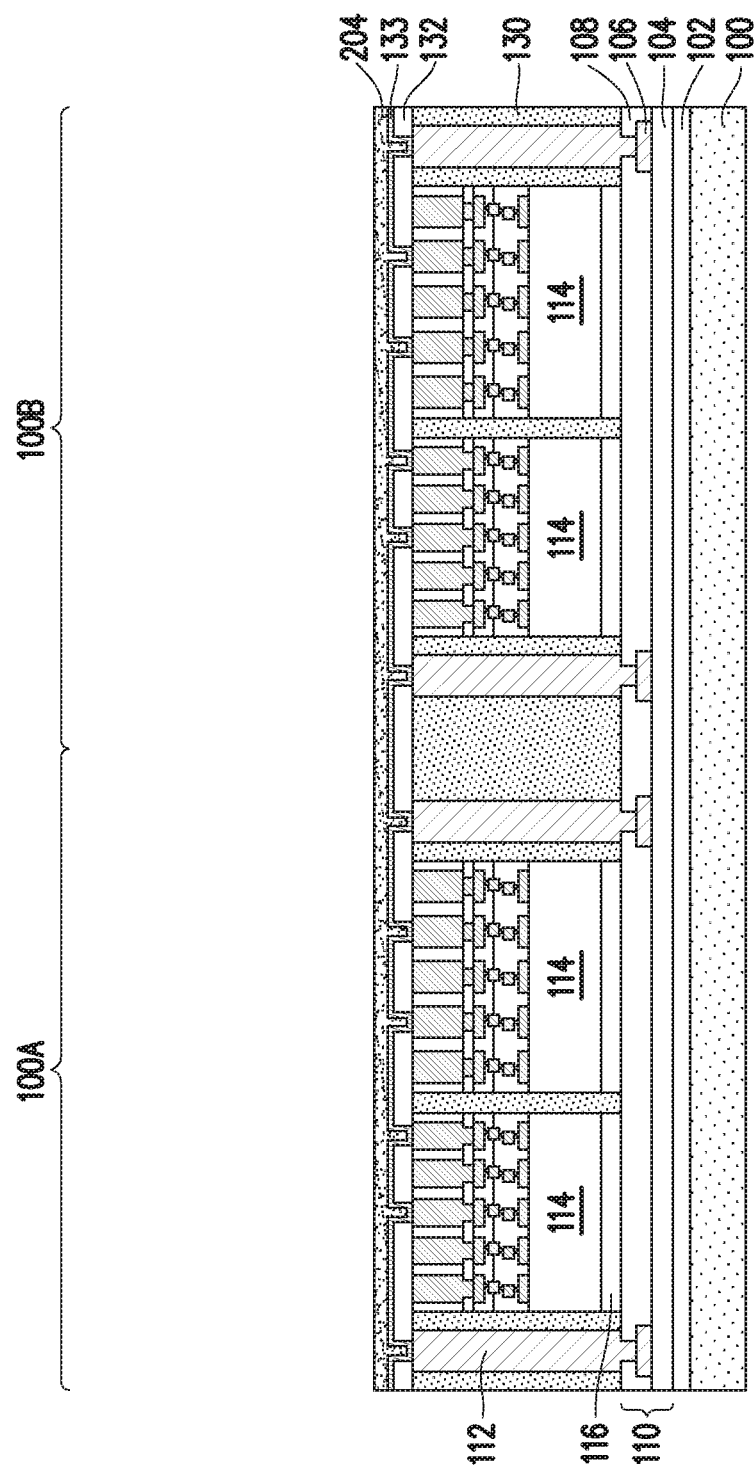

In FIGS. 7 through 9, the dielectric layer 132 is then patterned. The patterning forms openings to expose portions of the through vias 112 and the die connectors 126. The patterning may be achieved using a photolithographic process when the dielectric layer 132 is a photo-sensitive material.

An embodiment photolithographic process used to pattern the dielectric layer 132 may include performing multiple exposure steps in each of the package regions (e.g., the first package region 100A and the second package region 100B) over the carrier substrate 100. For example, in FIG. 7, the first package region 100A is divided into a first patterning region 200A and a second patterning region 200B. The first patterning region 200A overlaps the second patterning region 200B in stitching region 200C.

In FIG. 7, a first exposure is performed on the dielectric layer 132 in the first patterning region 200A using a first photomask reticle 202A. The exposed regions 132A of the dielectric layer 132 are thus formed. A size of the photomask reticle 202A may correspond to a size (e.g., diameter) of a lens used by a NA stepper to expose the dielectric layer 132 in the first patterning region 200A. For example, in a top down view (not shown), the photomask reticle 202A may have a length of about 52 mm and a width of about 34 mm to correspond to a photo lens used to expose the dielectric layer 132. Other dimensions of the photomask reticle 202A are also possible. Furthermore, a low NA stepper (e.g., having an NA less than 0.2) may be used to increase a DoF of the patterning process and reduce cost. As a result of the increased DoF, patterning defects resulting from warpage of various features may be advantageously reduced. Because the package wafer is relatively large, it may be especially susceptible to warpage, which increases a topography at the top surface of dielectric layer 132. By providing an increased DoF, patterning defects resulting from warpage and increased topography may be reduced. A low NA stepper may be used in various embodiments due to the relatively large feature size (e.g., critical dimension) of patterned features in the redistribution structure 160 (see FIG. 21).

Next, in FIG. 8, a second exposure is performed on the dielectric layer 132 in the second patterning region 200B using a second photomask reticle 202B. The exposed regions 132B of the dielectric layer 132 are thus formed. A size of the photomask reticle 202B may correspond to a size (e.g., diameter) of a lens used by a NA stepper to expose the dielectric layer 132 in the patterning region 200B. For example, in a top down view (not shown), the photomask reticle 202B may have a length of about 52 mm and a width of about 34 mm to correspond to a photo lens used to expose the dielectric layer 132. Other dimensions of the photomask reticle 202B are also possible. Furthermore, a low NA stepper (e.g., having an NA less than 0.2) may be used to increase a DoF of the patterning process and reduce cost. As a result of the increased DoF, patterning defects resulting from warpage and increased topography of the dielectric layer 132 may be reduced. A low NA stepper may be used in various embodiments due to the relatively large feature size (e.g., critical dimension) of patterned features in the redistribution structure 160 (see FIG. 21).

In this manner, a pattern for openings though the dielectric layer 132 is defined in the first package region 100A. An overall size of the pattern for openings in the first package region 100A need not be limited to a physical size of photo lenses used to expose the dielectric layer 132 because multiple exposure steps and photomask reticles can expand a size of a package formed in the each package region 100A and 100B.

Similar exposure steps may be performed in other package regions over the carrier substrate 100 (e.g., in the second package region 100B) in order to define a desired pattern in the dielectric layer 132. Exposing the second package region 100B may be performed after all exposure steps in the first package region 100A are completed. Alternatively, each photomask reticle (e.g., a first photomask reticle 202A) may be used to expose each package region over the carrier substrate 100B before subsequent photomask reticles (e.g., a second photomask reticle 202B) are used to expose the dielectric layer 132.

In FIG. 9, after the various patterning regions and package regions of the dielectric layer 132 are exposed, the dielectric layer 132 is developed to form openings extending through the dielectric layer 132. The openings may expose portions of the through vias 112 and the die connectors 126. FIG. 9 illustrates the dielectric layer 132 as a positive photo resist material where exposed areas 132A/132B are removed as a result of the dielectric layer 132 being developed. In other embodiments, the dielectric layer 132 may be a negative photo resist where exposed areas 132A/132B of the dielectric layer 132 remains while unexposed areas of the dielectric layer 132 are removed as a result of development.

In FIGS. 10 through 16F, metallization pattern 138 with vias is formed on the dielectric layer 132. As an example to form metallization pattern 138, a seed layer 133 is formed over the dielectric layer 132 and in openings through the dielectric layer 132. In some embodiments, the seed layer 133 is a metal layer, which may be a single layer or a composite layer comprising a plurality of sub-layers formed of different materials. In some embodiments, the seed layer 133 comprises a titanium layer and a copper layer over the titanium layer. The seed layer 133 may be formed using, for example, PVD or the like.

A photo resist 204 is then formed and patterned on the seed layer 133. The photo resist 204 may be formed by spin coating or the like and may be exposed to light for patterning. A multi-exposure process (e.g., stitching lithography) as described below will be used to expose multiple areas of the photo resist. After the multi exposure process, a single development process will be performed to remove exposed or unexposed portions of the photo resist depending on whether a negative or positive resist is used.

Figure 11A:
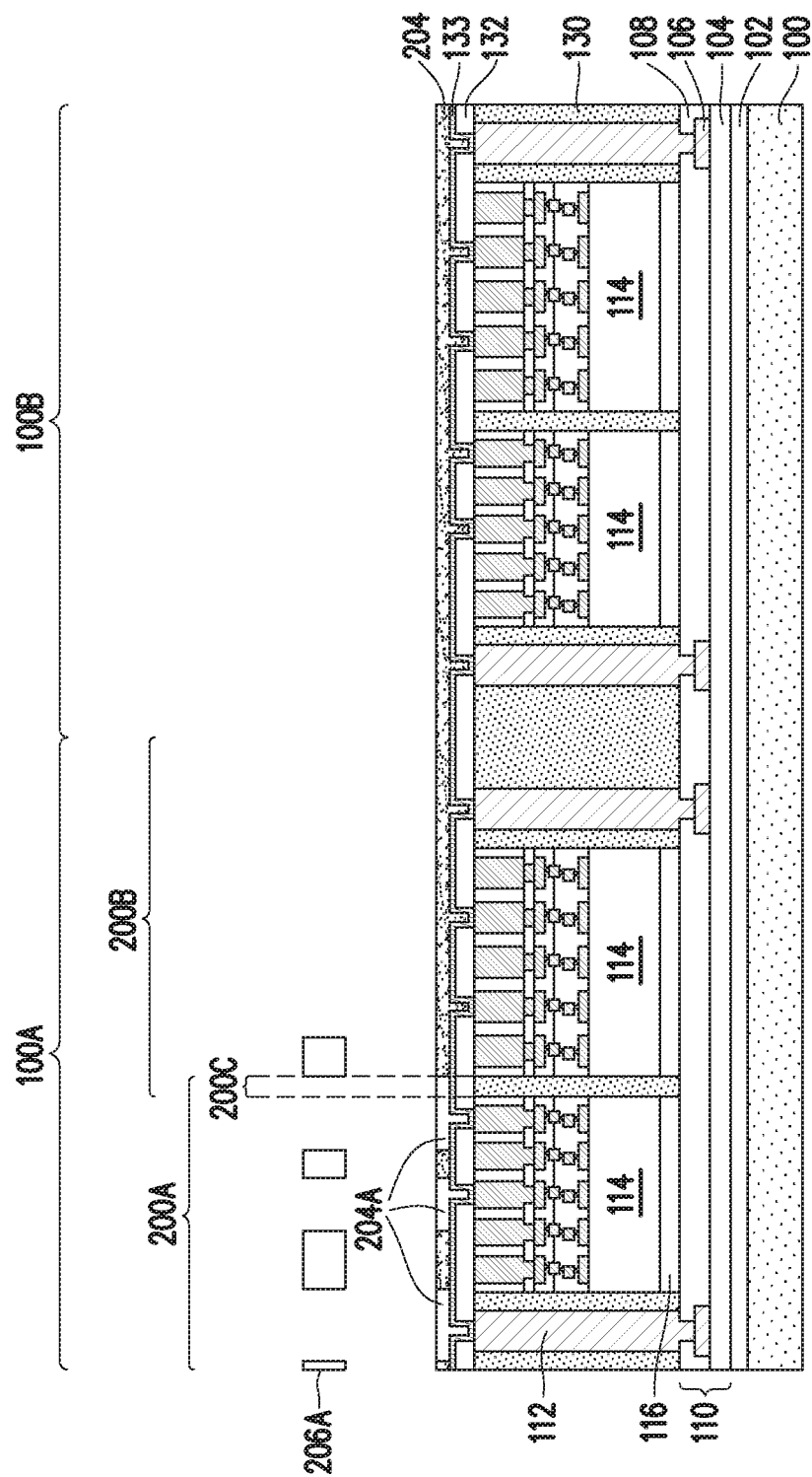

In FIG. 11A, a first exposure is performed on the photo resist 204 in the first patterning region 200A using a first photomask reticle 206A. The exposed regions 204A of the photo resist 204 are thus formed. A size of the photomask reticle 202A may correspond to a size (e.g., diameter) of a lens used by a NA stepper to expose the photo resist 204 in the first patterning region 200A. For example, in a top down view (not shown), the photomask reticle 206A may have a length of about 52 mm and a width of about 34 mm to correspond to a photo lens used to expose the photo resist 204. Other dimensions of the photomask reticle 206A are also possible. Furthermore, a low NA stepper (e.g., having an NA less than 0.2) may be used to increase a DoF of the patterning process and reduce cost. As a result of the increased DoF, patterning defects resulting from warpage and increased topography of the dielectric layer 132 may be reduced. A low NA stepper may be used in various embodiments due to the relatively large feature size (e.g., critical dimension) of patterned features in the redistribution structure 160 (see FIG. 21).

The exposed regions 204A extend into the stitching region 200C (e.g., where the first patterning region 200A and the second patterning region 200B overlap). The photomask reticle 206A may be designed to reduce the exposure dosage applied to the photo resist 204 in the stitching region 200C compared to areas of the first patterning region 200A outside of the stitching region 200C. For example, during an exposure step, light (e.g., ultraviolet (UV) light) is projected onto the photo resist 204 through the photomask reticle 206A. Openings in the photomask reticle 206A allow the light to shine onto the photo mask 204 while solid areas of the photomask reticle 206A block the light from shining onto the photo mask 204. A shape and size of openings in the photomask reticle 206A may reduce a transmittance of light in the stitching region 200C compared to areas of the first patterning region 200A outside of the stitching region 200C. For example, the photomask reticle 206A may allow a transmittance of light in the first patterning region 200A outside of the stitching region 200C to be 100%, while the photomask reticle 206A may allow a transmittance of light in the stitching region 200C to gradually reduce from 100% to about 0% in a direction towards the second patterning region 200B. This may be achieved by selecting an appropriate shape of the openings of the photomask reticle 206A over the stitching region 200C and reducing an area of the openings in the photomask reticle 206A over the stitching region 200C.

Figure 11B:
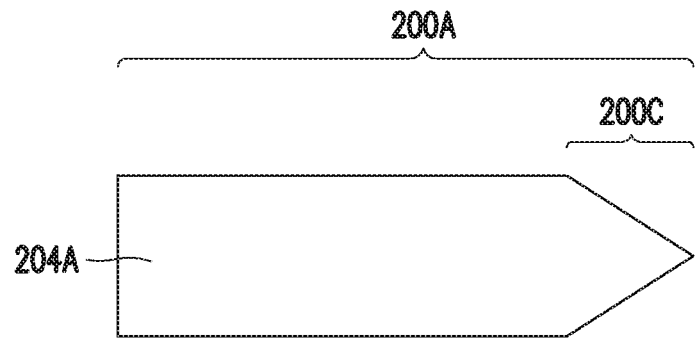
Figure 11C:
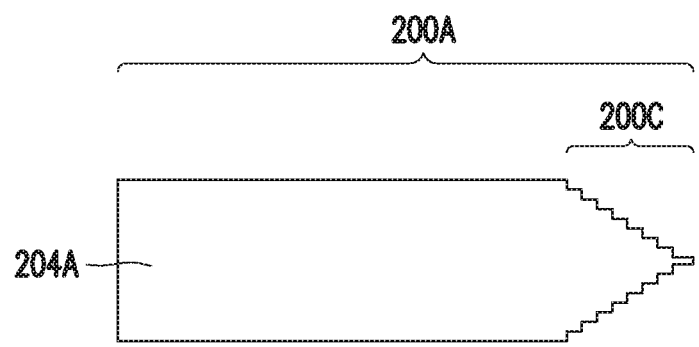

FIGS. 11B and 11C illustrate top-down views of the exposed regions 204A in the first patterning region 200A both outside of and within the stitching region 200C according to various embodiments. The shapes of the exposed regions 204A correspond to shapes of openings in the photomask reticle 206A. As illustrated by FIGS. 11B and 11C, a width of the exposed regions 204A decreases as the exposed regions 204A extend into the stitching region 200C such that the exposed region 204A has a triangular shape in the stitching region 200C. The triangular shape of the exposed regions 204B may span across an entirety of the stitching region 200C. For example, the triangular shape may start at a first edge of the stitching region 200C and narrow to a vertex at a second edge of the stitching region 200C, the second edge being opposite the first edge. In the stitching region 200C, the width of the exposed region 204A may be constantly decreasing (e.g., as illustrated by FIG. 11B) or discretely decreasing at set intervals (e.g., as illustrated by FIG. 11C).

As a result of the embodiment shapes and varying widths of the exposed region 204A, the exposure intensity of the exposed region 204A is reduced as the exposed regions 204A extend into the stitching region 200C. By configuring the exposed region 204A to have the illustrated shapes in the stitching region 200C (e.g., by configuring corresponding openings in the photomask reticle 206A over the stitching region 200C), exposure intensity within the stitching region 200C may also be gradually reduced, which reduces overexposure defects and increases overlay tolerance as will be described in detail below.

Figure 12A:
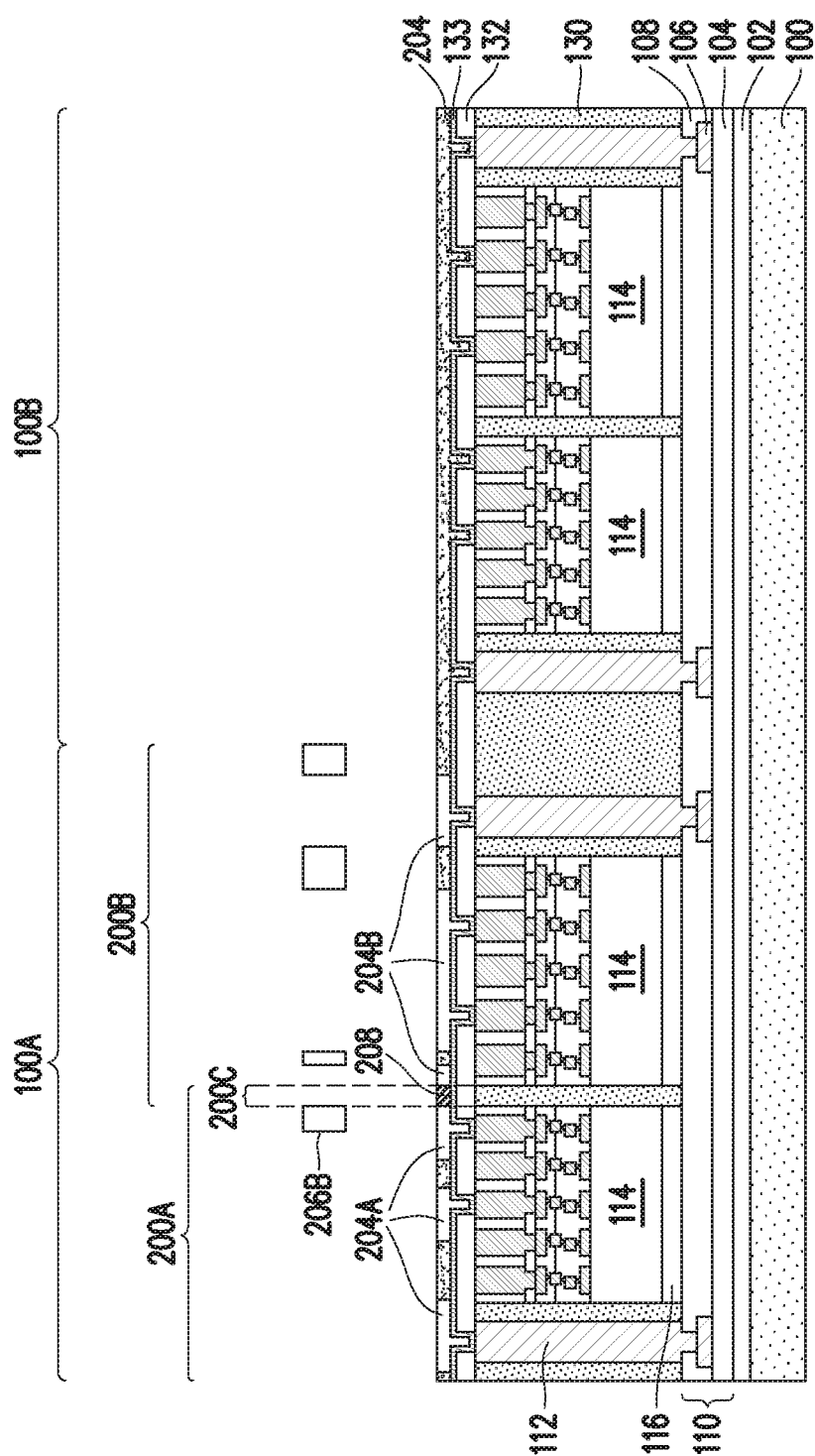

Next, in FIG. 12A, a second exposure is performed on the photo resist 204 in the second patterning region 200B using a second photomask reticle 206B. The exposed regions 204B of the photo resist 204 are thus formed. A size of the photomask reticle 202B may correspond to a size (e.g., diameter) of a lens used by a NA stepper to expose the photo resist 204 in the first patterning region 200A. For example, in a top down view (not shown), the photomask reticle 206B may have a length of about 52 mm and a width of about 34 mm to correspond to a photo lens used to expose the photo resist 204. Other dimensions of the photomask reticle 206B are also possible. Furthermore, a low NA stepper (e.g., having an NA less than 0.2) may be used to increase a DoF of the patterning process and reduce cost. As a result of the increased DoF, patterning defects resulting from warpage and increased topography of the dielectric layer 132 may be reduced. A low NA stepper may be used in various embodiments due to the relatively large feature size (e.g., critical dimension) of patterned features in the redistribution structure 160 (see FIG. 21).

The exposed regions 204B extend into the stitching region 200C (e.g., where the first patterning region 200A and the second patterning region 200B overlap). The exposed regions 204B may overlap the exposed regions 204A in the stitching region 200C such that the photo resist 204 includes a stitched exposed region extending continuously from the first patterning region 200A (specifically an area of the first patterning region 200A outside of the stitching region 200C) through the stitching region 200C to the second patterning region 200B (specifically an area of the second patterning region 200B outside of the stitching region 200C).

Similar to the photomask reticle 200A, the photomask reticle 206B may be designed to reduce the exposure dosage applied to the photo resist 204 in the stitching region 200C compared to areas of the second patterning region 200B outside of the stitching region 200C. A shape and size of openings in the photomask reticle 206B may reduce a transmittance of light in the stitching region 200C compared to areas of the second patterning region 200B outside of the stitching region 200C. For example, the photomask reticle 206B may allow a transmittance of light in the second patterning region 200B outside of the stitching region 200C to be 100%, while the photomask reticle 206B may allow a transmittance of light in the stitching region 200C to gradually reduce from 100% to about 0% in a direction towards the first patterning region 200A. This may be achieved by selecting an appropriate shape of the openings of the photomask reticle 206B over the stitching region 200C and reducing an area of the openings in the photomask reticle 206B over the stitching region 200C.

Figure 12B:
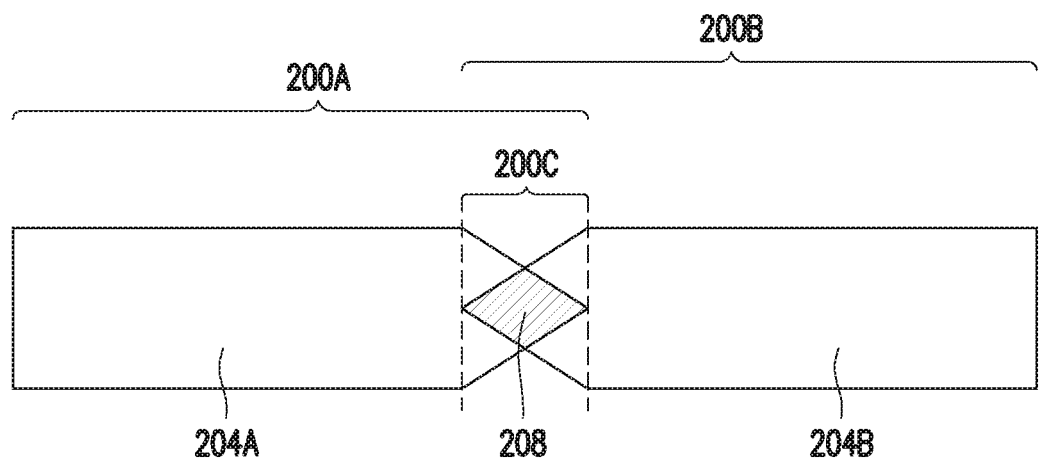
Figure 12C:
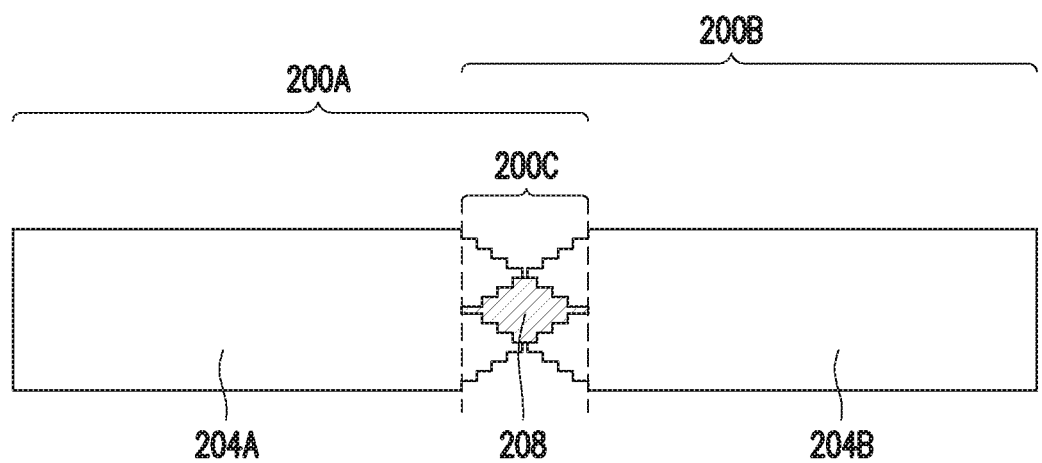

FIGS. 12B and 12C illustrate top-down views of the exposed regions 204A and the exposed regions 204B in the first and second patterning regions 200A and 200B according to various embodiments. The shapes of the exposed regions 204B correspond to shapes of openings in the photomask reticle 206B. As illustrated by FIGS. 12B and 12C, a width of the exposed regions 204B decreases as the exposed regions 204B extend into the stitching region 200C such that the exposed region 204B has a triangular shape in the stitching region 200C. The triangular shape of the exposed regions 204B may span across an entirety of the stitching region 200C. For example, the triangular shape may start at the second edge of the stitching region 200C and narrow to a vertex at the first edge of the stitching edge 200C. In the stitching region 200C, the width of the exposed region 204B may be constantly decreasing (e.g., as illustrated by FIG. 12B) or discretely decreasing at set intervals (e.g., as illustrated by FIG. 12C).

As a result of the embodiment shapes and varying widths of the exposed region 204B, the exposure intensity of the exposed region 204B is reduced as the exposed regions 204B extend into the stitching region 200C. By configuring the exposed region 204B to have the illustrated shapes in the stitching region 200C (e.g., by configuring corresponding openings in the photomask reticle 206B over the stitching region 200C), exposure intensity of the exposed regions 204B within the stitching region 200C may also be gradually reduced, which reduces overexposure defects and increases overlay tolerance.

Figure 12D:
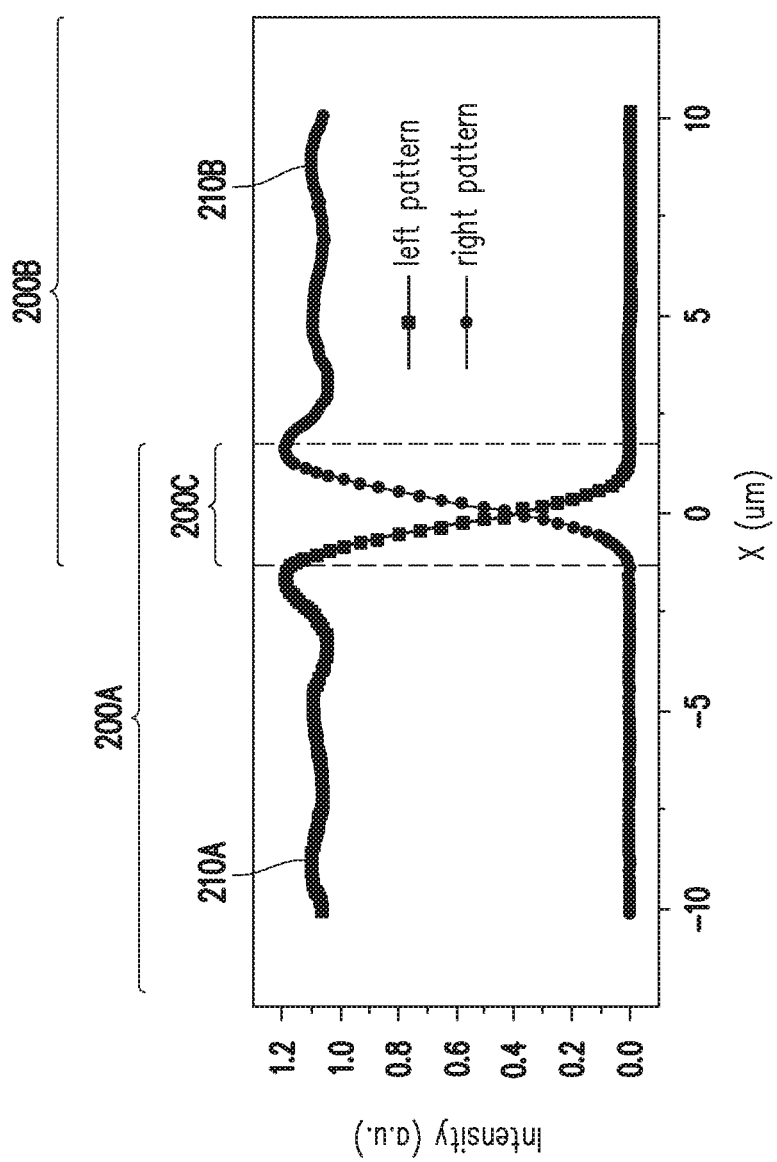
FIG. 12D illustrates a graph of exposure intensities of a lithography process according to various embodiments.

The exposed regions 204A and 204B overlap at overlap region 208. When the exposure intensity is not reduced in the stitching region 200C, the overlap region 208 may be overexposed (e.g., having an exposure intensity of about 200%). By gradually reducing the exposure intensity of the exposed regions 204A and 204B in the stitching region 200C, the risk of overexposing overlap region 208 is reduced because the cumulative exposure intensity of the overlap region 208 resulting from the first exposure (e.g., to define the exposed region 204A) and the second exposure (e.g., to define the exposed region 204B) is reduced. For example, FIG. 12D illustrates exposure intensities of the exposed regions 204A and 204B throughout the first patterning region 200A and the second patterning region 200B. In FIG. 12D, the x-axis designates location and the y-axis designates exposure intensity. Curve 210A corresponds to the exposure intensity of the exposed region 204A and curve 210B corresponds to the exposure intensity of exposed region 204B. Slopes of the curves 210A and 210B in the stitching region 200C may correspond to and be determined by a distance spanned the stitching region 200C, which determines a length of the triangular shape of each exposed region 204A/204B. The cumulative exposure intensity of any given location of the photo resist 204 may be obtained by adding the corresponding intensities of the curves 210A and 210B. As can be seen in FIG. 12D, the cumulative exposure intensity at any given location in the first patterning region 200A and the second patterning region 200B is in the range of about 1 (e.g., 100%) and about 1.2 (e.g., 120%). In particular, in the cumulative exposure intensity in the stitching region 200C (where two exposure steps was performed) is substantially the same as the cumulative exposure intensity outside of the stitching region 200C (where only one exposure step was performed). By reducing overexposure, defects (e.g., defining overly large features) resulting from overexposure can also be reduced.

Figure 13A:
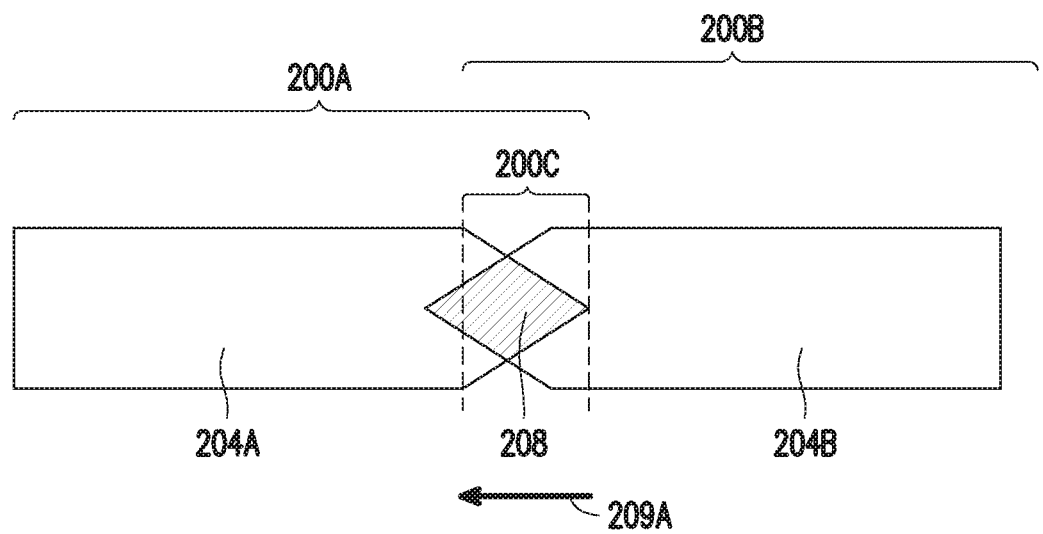
Figure 13B:
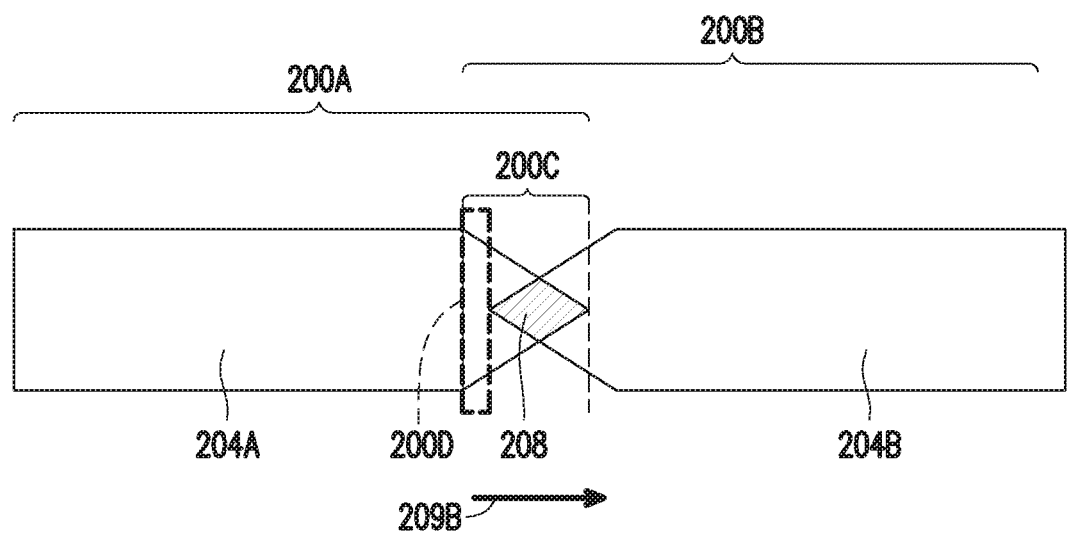
Figure 13C:
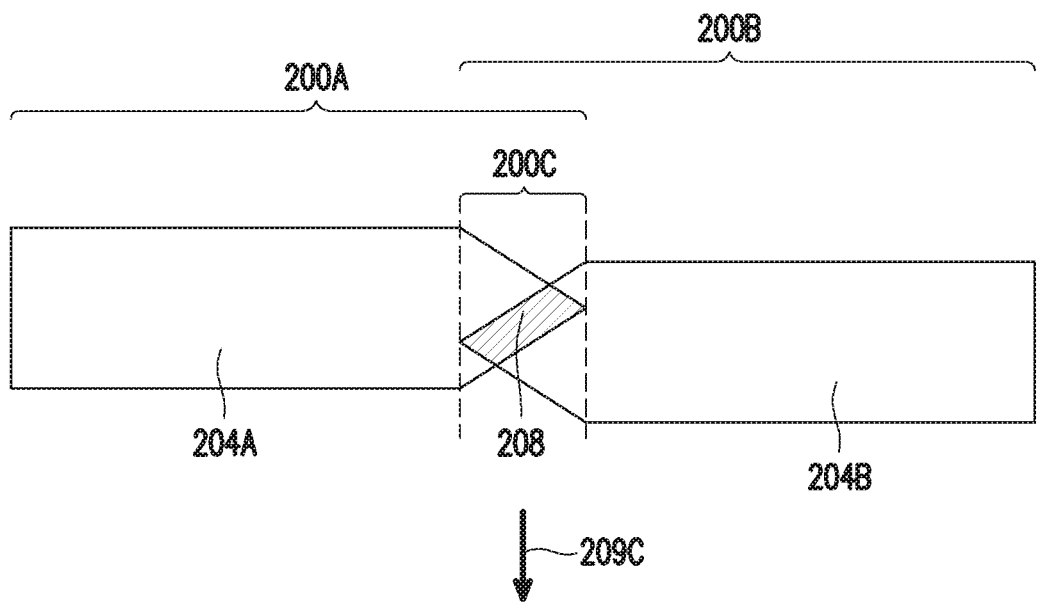
Figure 13D:
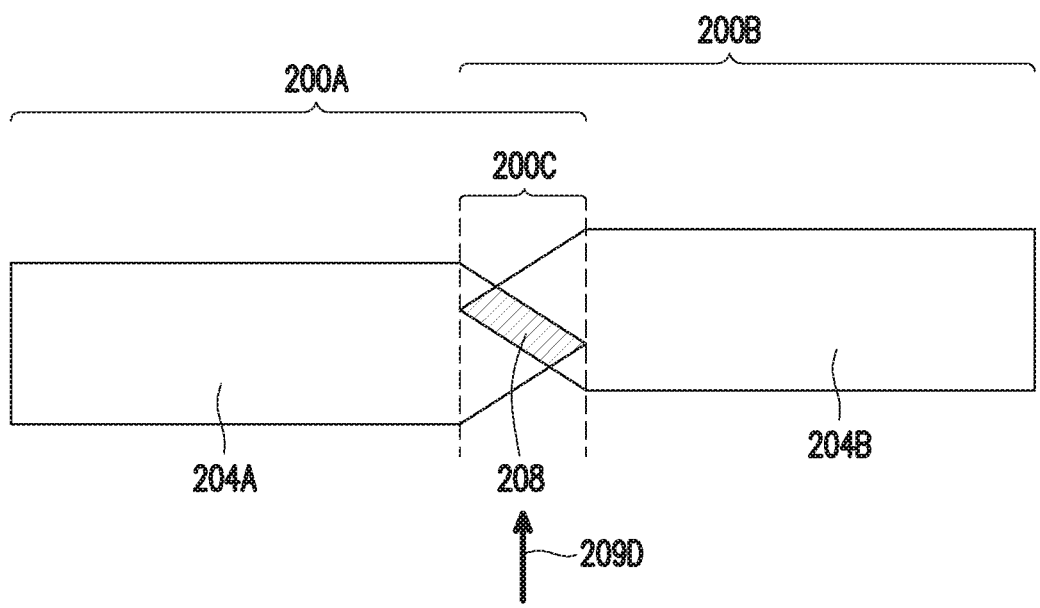

Further, the triangular shapes of the exposed regions 204A and 204B in the stitching region 200C may also increase overlay tolerance. FIGS. 13A, 13B, 13C, and 13D illustrate embodiment overlay errors, which may result from alignment errors between the photomask reticle 206A and the photomask reticle 206B. FIG. 13A illustrates an embodiment wherein the photomask reticle 206B is shifted laterally in a direction towards the first patterning region 200A as indicated by arrow 209A. As a result, the exposed region 204B may extend into an area of the first patterning region 200A outside of the stitching region 200C. FIG. 13B illustrates an embodiment wherein the photomask reticle 206B is shifted laterally in a direction towards the second patterning region 200B as indicated by arrow 209A. As a result, the exposed region 204B does not extend full across the stitching region 200C. FIGS. 13C and 13D illustrate embodiments wherein the photomask reticle 206B is shifted vertically such that edges of the exposed regions 204A and 204B are no longer aligned as indicated by arrows 209C and 209D. Although each of the FIGS. 13A, 13B, 13C, and 13D illustrate a single overlay error, it is understood that these errors may be combined as well. It has been observed that by providing exposed regions 204A and 204B with triangular shapes allows for an overlay error of up to 10% in any direction while still being within manufacturing tolerances.

The triangular shapes of the exposed regions 204A and 204B in the stitching region 200C allows for linear changes in exposure intensity such that any shift does not significantly impact cumulative exposure intensity. For example, in FIG. 13A, the portion of the exposed region 204B in the first patterning region 200A outside of stitching region 200C may have a relatively low exposure intensity (e.g., less than about 20%). As a result, although the exposed region 204A in the first patterning region 200A outside of the overlap region 200C is fully exposed (e.g., having an exposure intensity of about 100%), the cumulative exposure intensity of the exposed regions 204A and 204B is maintained at around 120%, which is within manufacturing tolerances even with the illustrated overlay error of FIG. 13A. As another example, in FIG. 13B, the exposed region 204B does not extend into region 200D of the stitching region 200C. For example, in the region 200D, only one exposure is performed (i.e., the exposure corresponding to the exposed region 204A). However, because the exposed region 204A has an almost full exposure intensity (e.g., at least 80%) in the region 200D, the lack of exposure from the second exposure step does not result in an unacceptably underexposed area. For example, in the region 200D, the cumulative exposure intensity of the exposed regions 204A and 204B is maintained at around 80%, which is within manufacturing tolerances even with the illustrated overlay error of FIG. 13B.

Figure 14B:
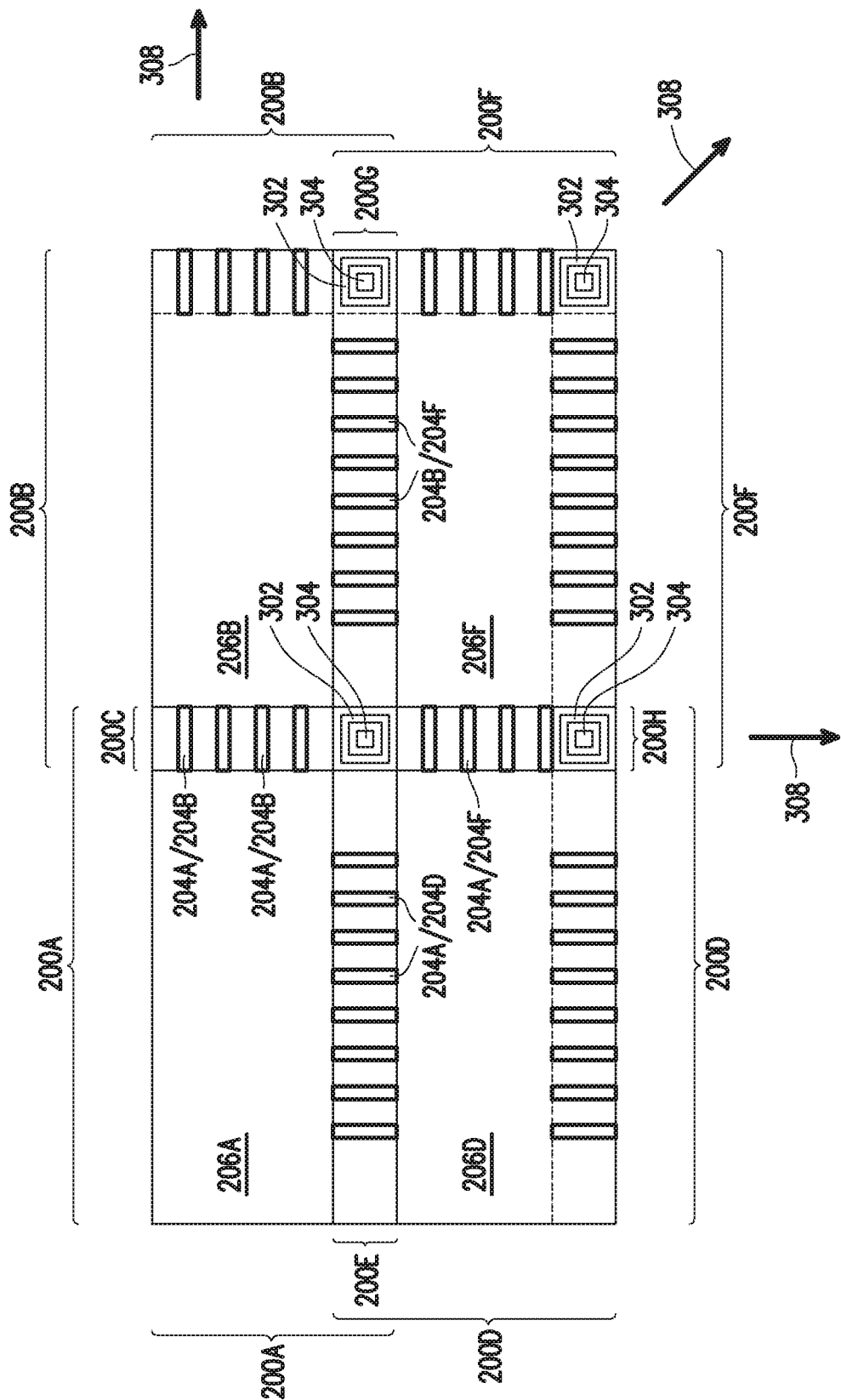

Thus, the photo resist 214 is exposed using multiple photomask reticles 206A/206B to extend the size of a pattern across a stitching zone. Although only two exposure steps are described above, it should be understood that any number of exposure steps could be applied to the photo resist 214. For example, if an even larger area is desired, additional exposure steps could be applied. Each of the additional exposure steps may overlap a previous exposure step in additional stitching zones. For example, FIGS. 14A and 14B illustrate multiple stitching zones. Different photomask reticles 206A, 206B, 206D, and 206F are used to define patterns in different patterning regions 200A, 200B, 200D, and 200F, respectively, of a wafer. The patterning regions 200A and 200B overlap in a stitching region 200C; the patterning regions 200A and 200D overlap in a stitching 200E; the patterning regions 200B and 200F overlap in a stitching region 200G; and the patterning regions 200D and 200F overlap in a stitching region 200H. The exposed regions 204A and 204B extend through the stitching region 200C; the exposed regions 204A and 204D extend through the stitching region 200E; the exposed regions 204B and 204F extend through the stitching region 200G; and the exposed regions 204D and 204F extend through the stitching region 200H. Alignment marks 302 are used to align the photomask reticles 206A, 206B, 206D, and 206F with a pattern of an underlying layer (e.g., a pattern of the dielectric layer 132, see FIG. 10). Overlay marks 304 are used to align the patterns of photomask reticles 206A, 206B, 206D, and 206F with other photomask reticles 206A, 206B, 206D, and 206F. For example, overlay mark 304A may be used to align photomask reticles 206A and 206B; overlay mark 304B may be used to align photomask reticles 206B and 206B; and overlay mark 304C may be used to align photomask reticles 206A and 206D. The alignment marks 302 and 304 may overlap to reduce an area needed for alignment marks. When alignment marks 302 and 304 are placed outside of the patterning regions (e.g., 200A, 200B, etc.), the size of the pattern may be extended in one direction (e.g., as indicated by arrow 306 in FIG. 14A). When alignment marks 302 and 304 are placed inside of the patterning regions (e.g., 200A, 200B, etc.), the size of the pattern may be extended in multiple direction (e.g., as indicated by arrows 308 in FIG. 14B). Further, due to the use of multiple photomask reticles to stitch together a pattern of a layer, alignment marks 302 and overlay marks 304 may be disposed at regular intervals around the pattern (e.g., as illustrated by FIG. 14A) or throughout the pattern (e.g., as illustrated by FIG. 14B). An interval between adjacent alignment marks 302/overlay marks 304 may correspond to a size of the photomask reticles.

Thus, by providing multiple exposure steps, a larger wafer may be patterned by using multiple photomask reticles to define overlapping patterns in stitching regions. The multiple exposure steps may be applied using a low NA lithography tool with a high DoF, which allows the patterns to defined even in cases of warpage. A shape of the overlapping patterns may be triangular to reduce exposure intensity in stitching regions. By reducing exposure intensity, manufacturing tolerances may be improved and defects may be reduced. Alternatively, other shapes may be employed that reduce exposure intensity in the stitching region to accommodate multiple exposure steps.

Similar exposure steps may be performed in other package regions over the carrier substrate 100 (e.g., in the second package region 100B) in order to define a desired pattern in the photo resist 204. Exposing the second package region 100B may be performed after all exposure steps in the first package region 100A are completed. Alternatively, each photomask reticle (e.g., a first photomask reticle 206A) may be used to expose each package region over the carrier substrate 100B before subsequent photomask reticles (e.g., a second photomask reticle 206B) are used to expose the photo resist 204.

Figure 15:
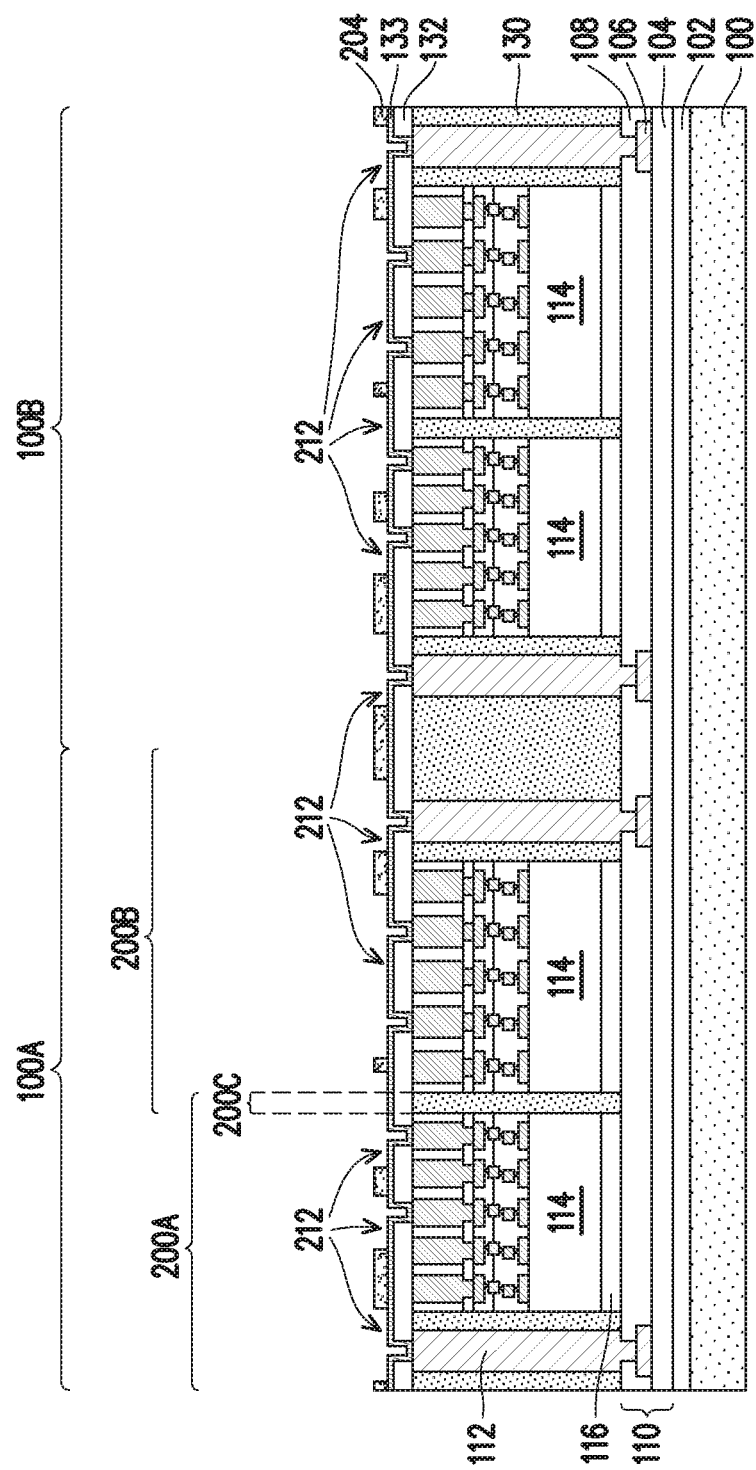

In FIG. 15, after the various patterning regions and package regions of the photo resist 204 are exposed, the photo resist 204 is developed to form openings 212 extending through the photo resist 204. FIG. 15 illustrates the photo resist 204 as a positive photo resist material where exposed areas 204A/204B are removed as a result of the photo resist 204 being developed. In other embodiments, the photo resist 204 may be a negative photo resist where exposed areas 204A/204B of the photo resist 204 remains while unexposed areas of the photo resist 204 are removed as a result of development.

Subsequently, in FIG. 16A, a conductive material is formed in the openings 212 by plating, such as electroplating or electroless plating, or the like. The conductive material may comprise a metal, like copper, titanium, tungsten, aluminum, or the like. Then, the photo resist 204 and portions of the seed layer 133 on which the conductive material is not formed are removed. The photo resist 204 may be removed by an acceptable ashing or stripping process, such as using an oxygen plasma or the like. Once the photo resist 204 is removed, exposed portions of the seed layer 133 are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

Figure 16A:
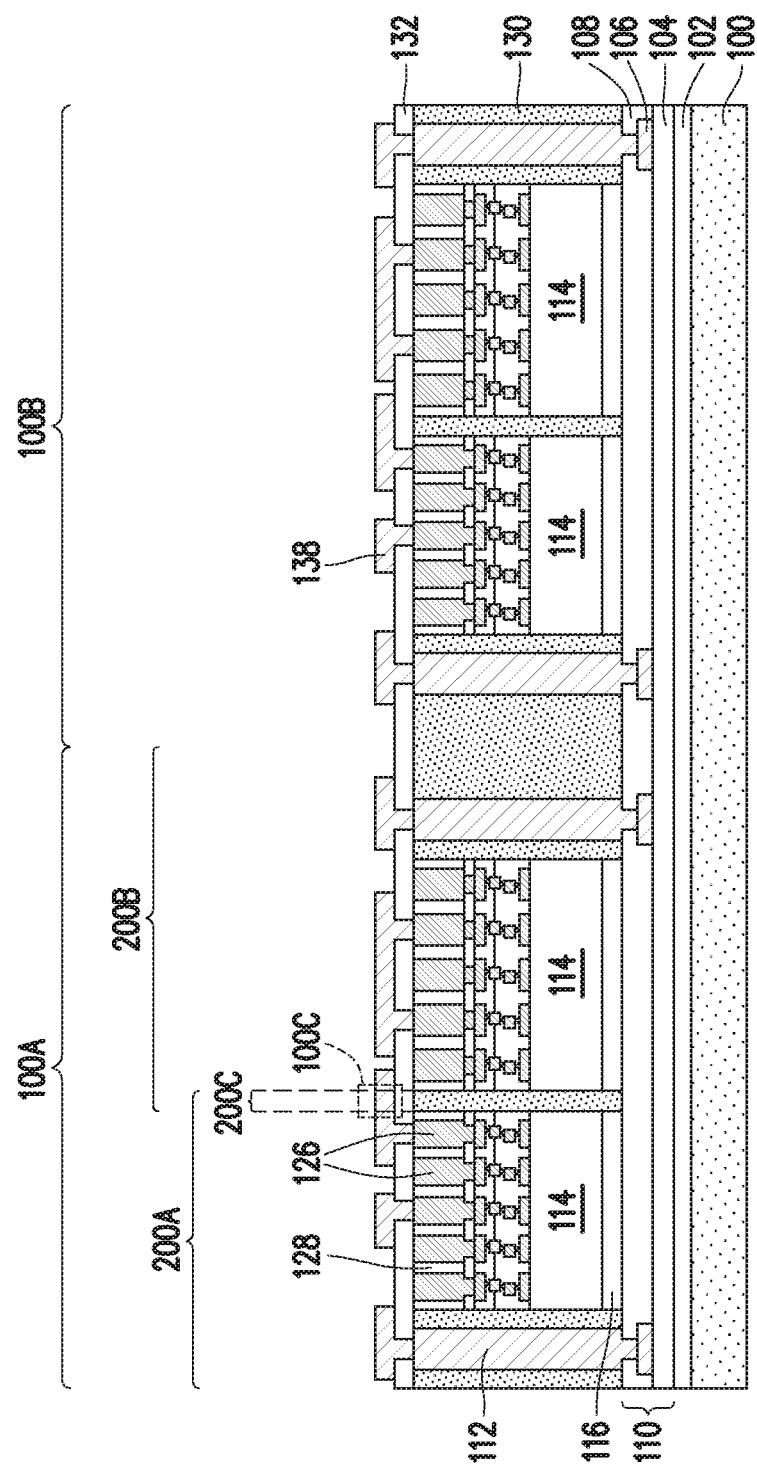

FIG. 16A illustrates a cross-sectional view of the metallization pattern 138. FIGS. 16B, 16C, 16D, 16E, and 16F illustrate top-down views of the metallization pattern 138 in the region 100C (see FIG. 16A). The region 100C includes a portion of the first patterning region 200A, the second patterning region 200B, and the stitching region 200C. The location of the metallization pattern 138 may further correspond to the exposed regions 204A/204B/204D/204F illustrated by FIGS. 14A and 14B. For example, the metallization patterns 138 may include conductive lines disposed between adjacent alignment marks 302/overlay marks 304.

Figure 16B:
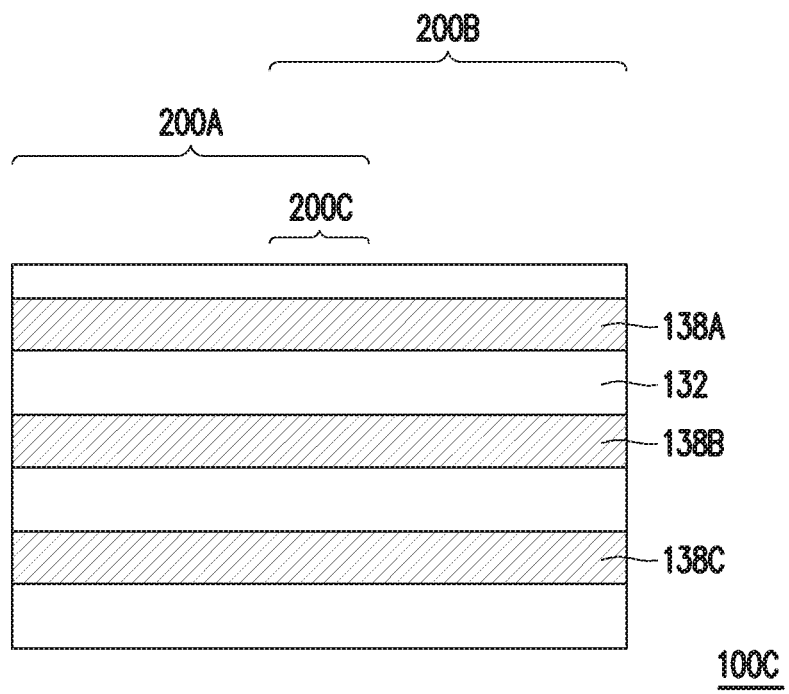
Figure 16C:
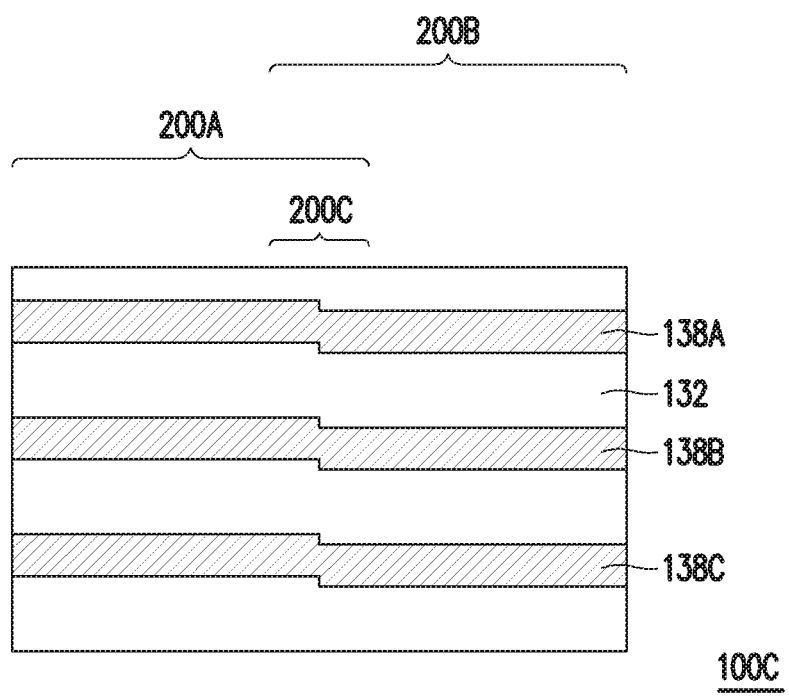
Figure 16D:
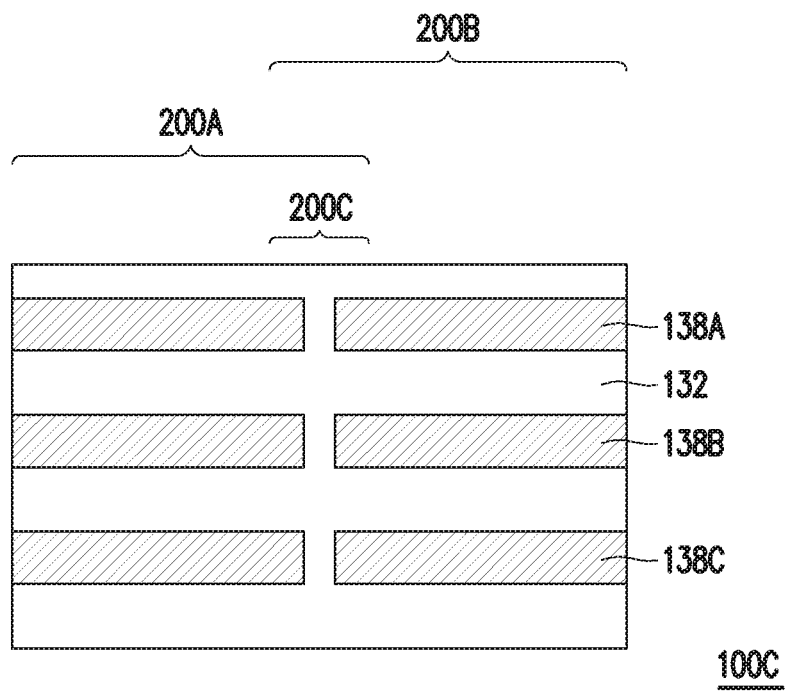
Figure 16E:
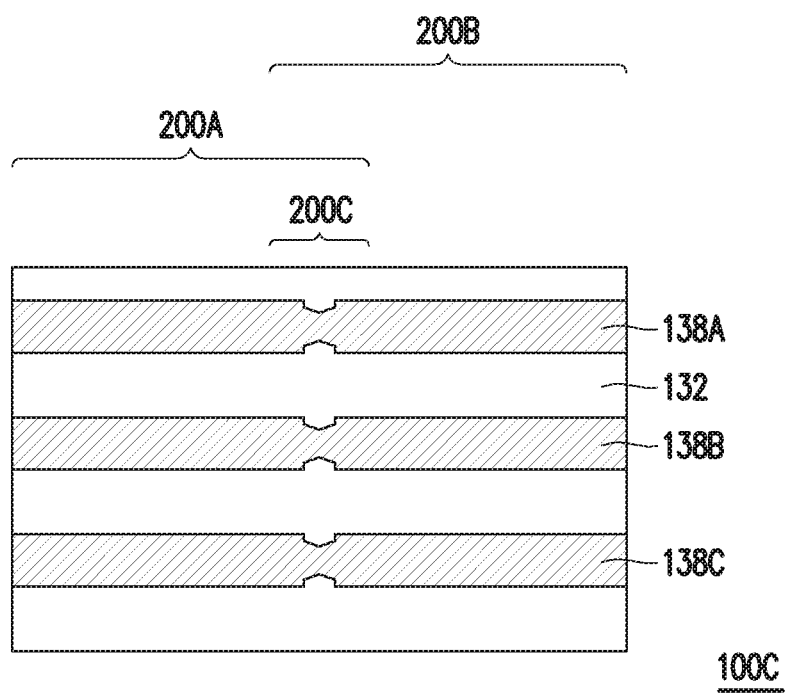
Figure 16F:
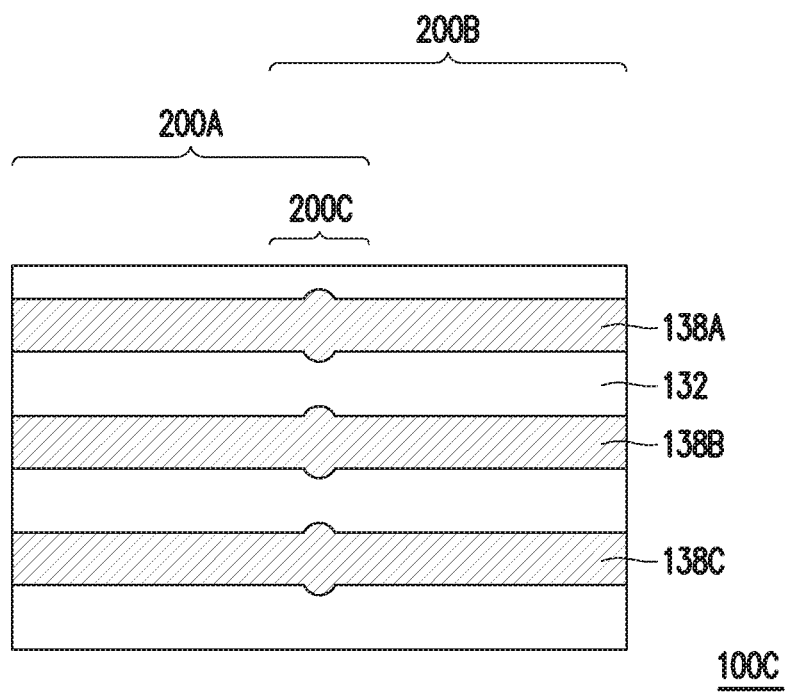

In FIG. 16B, the metallization patterns 138A, 138B, and 138C are formed without manufacturing anomalies to define conductive redistribution lines, which extend continuously from the patterning region 200A through the stitching region 200C to the patterning region 200B. In FIGS. 16C, 16D, 16E, and 16F, the metallization patterns 138A, 138B, and 138C are formed with manufacturing anomalies to define conductive redistribution lines, which extend from the patterning region 200A through the stitching region 200C to the patterning region 200B. Because the manufacturing anomalies are due to overlay errors between the photomask reticles (e.g., 206A and 206B), each of the metallization patterns 138A, 138B, and 138C may have a same type of manufacturing anomaly within the stitching region 200C. In FIG. 16C, a shift error occurs the stitching region 200C, which defines a manufacturing anomaly where sidewalls of the metallization patterns 138A/138B/138C are no longer aligned. In FIG. 16D, a gap is present in each of the metallization patterns 138A, 138B, and 138C in the stitching region 200C. This gap may be acceptable, for example, when the metallization patterns 138A, 138B, and 138C define dummy patterns. A size of the gap in each of the metallization patterns 138A, 138B, and 138C may be the same. In FIG. 16E, each of the metallization patterns 138A, 138B, and 138C in the stitching region 200C has a narrower region (e.g., referred to as necking). An amount each of the metallization patterns 138A, 138B, and 138C narrows in the stitching region 200C may be the same. The manufacturing anomalies illustrated by FIGS. 16D and 16E may result from underexposure in the stitching region 200C (e.g., as described above with respect to FIG. 13B). In FIG. 16F, each of the metallization patterns 138A, 138B, and 138C in the stitching region 200C has a wider region (e.g., referred to as bulging). An amount each of the metallization patterns 138A, 138B, and 138C widens in the stitching region 200C may be the same. The manufacturing anomalies illustrated by FIG. 16F may result from overexposure in the stitching region 200C (e.g., as described above with respect to FIG. 13A). Other manufacturing anomalies are also possible, but in general the anomalies are within manufacturing tolerances due to the embodiment patterning methods described above. In various embodiments, every metallization pattern in a stitching region (e.g., stitching region 200C) may have a same type of manufacturing anomaly because these anomalies are the result of overlay errors caused by the multiple exposure steps and the same overlay errors would apply across the entire stitching region 200C. In general, a manufacturing anomaly may be detected as a difference in shape between the intended pattern of a conductive feature as defined in a photomask or layout file and the manufactured, physical pattern of the conductive feature. In various embodiments, manufacturing anomalies within a single stitching region may include uneven conductive lines, conductive lines with non-linear edges within each conductive line, conductive lines with varying widths within each conductive line, or the like.

Figure 17:
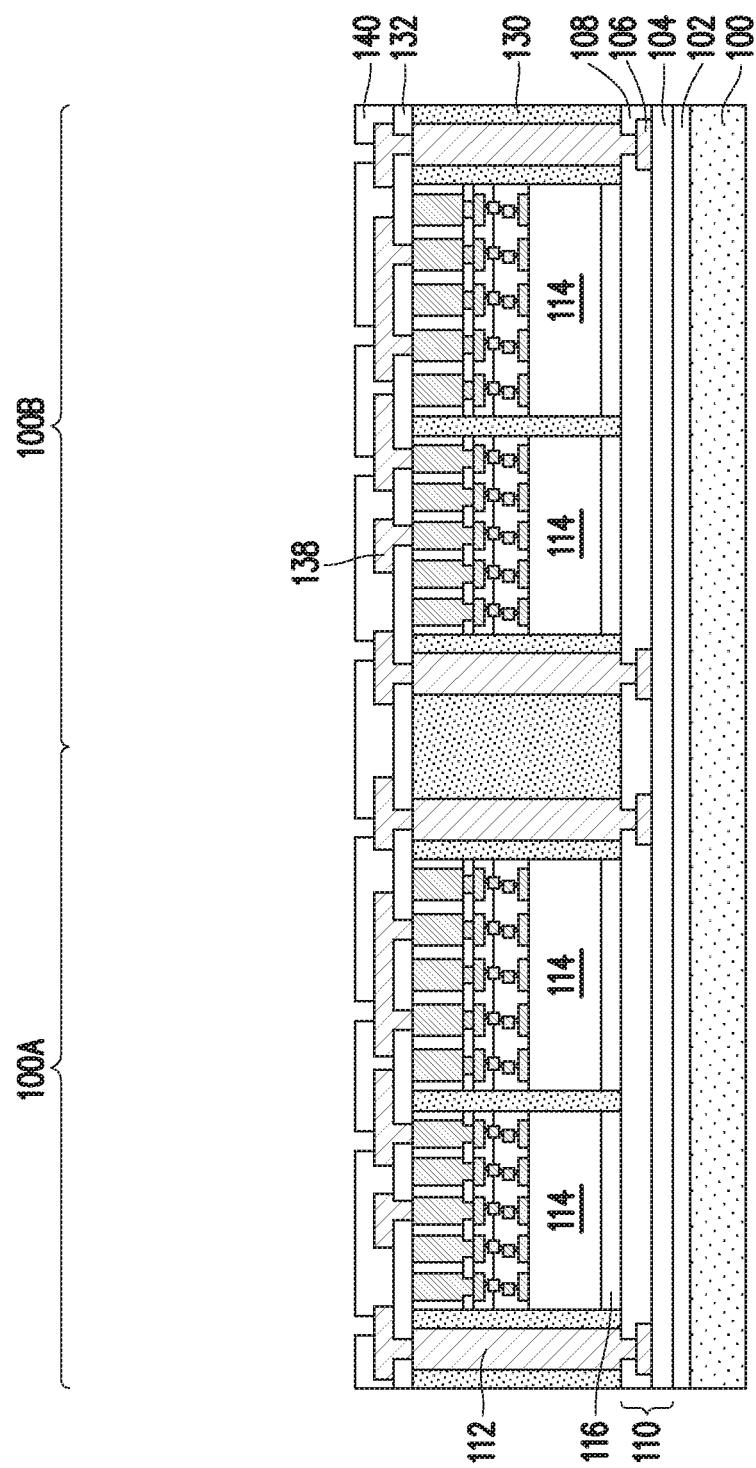

In FIG. 17, the dielectric layer 140 is deposited on the metallization pattern 138 and the dielectric layer 132. The dielectric layer 140 may be made of a similar material and deposited using a similar process as the dielectric layer 132.

After the dielectric layer 140 is deposited, it may be patterned to form openings exposing portions of the metallization pattern 138. The patterning of the dielectric layer 140 may be by an acceptable process, such as a process similar to the multi-exposure patterning process described above with respect to patterning the dielectric layer 132.

Figure 18:
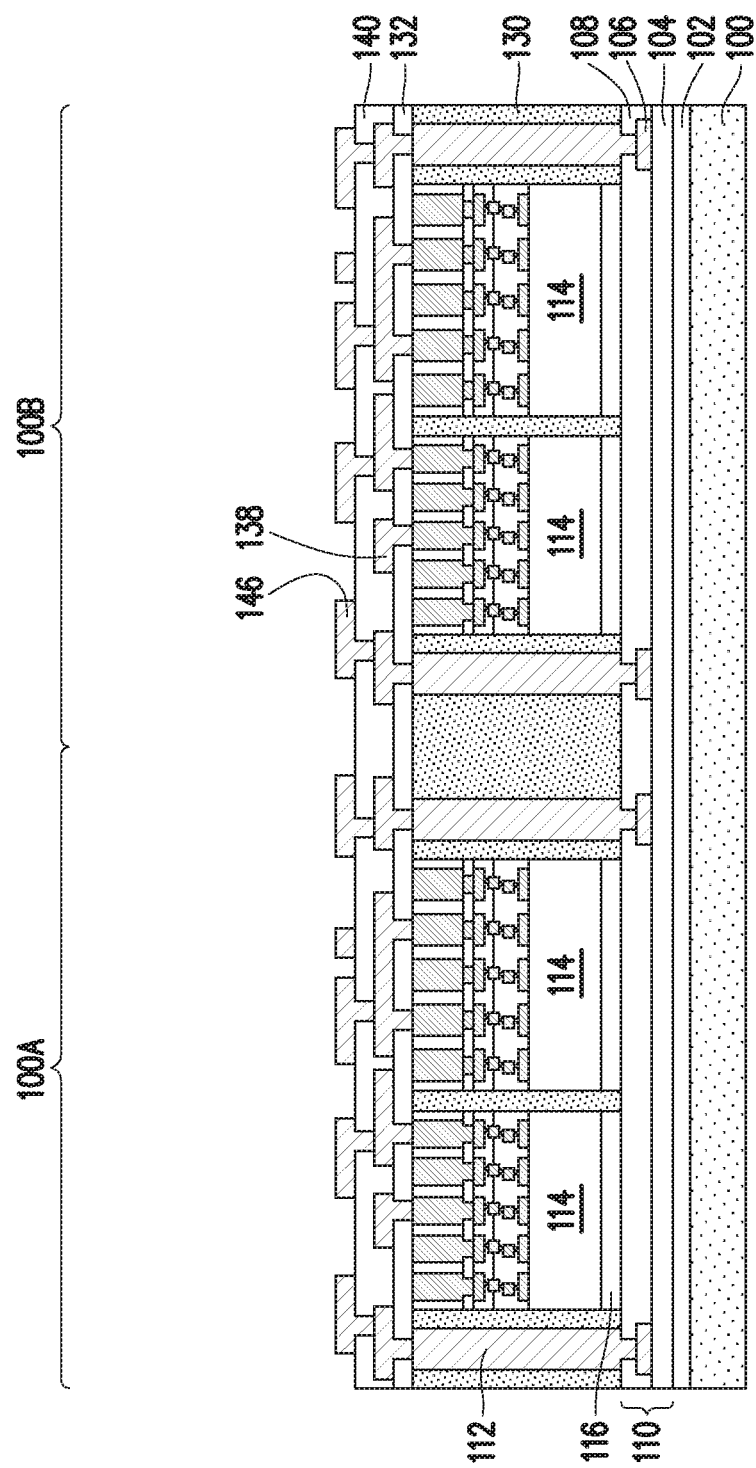

In FIG. 18, metallization pattern 146 with vias is formed on the dielectric layer 140. The metallization pattern 146 may be made of a similar material and formed using a similar process as the metallization pattern 138. For example, a seed layer may be deposited, a photo resist may be deposited on the seed layer, a multi-exposure lithography process as described above may be applied to the photo resist to define openings exposing the seed layer, a plating process may be performed to plate a conductive material on the exposed portions of the seed layer, and the photo resist and portions of the seed layer on which the conductive material is not formed are removed. The remaining portions of the seed layer and conductive material form the metallization pattern 146 and vias. The vias are formed in openings through the dielectric layer 140 to, e.g., portions of the metallization pattern 138.

Figure 19:
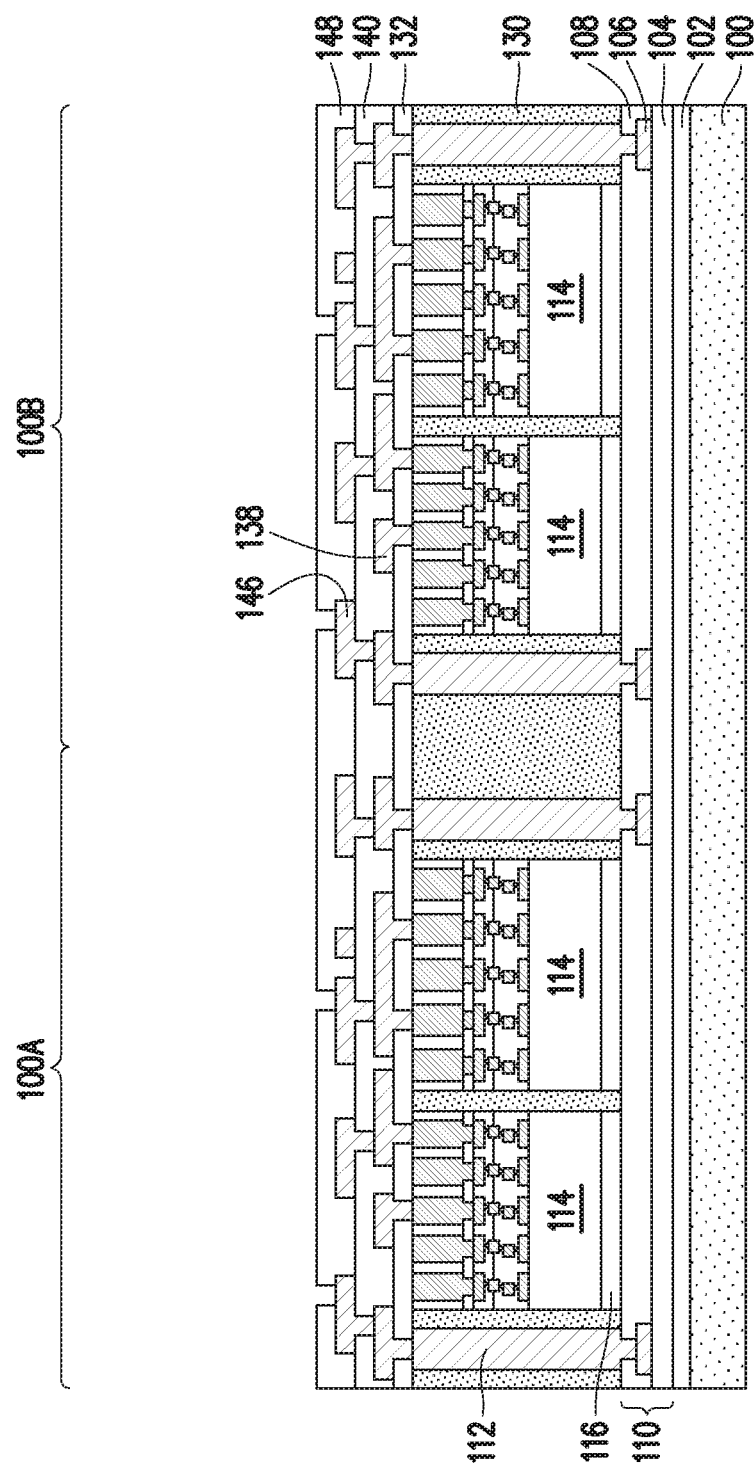

In FIG. 19, the dielectric layer 148 is deposited on the metallization pattern 146 and the dielectric layer 140. The dielectric layer 148 may be made of a similar material and deposited using a similar process as the dielectric layer 132. After the dielectric layer 148 is deposited, it may be patterned to form openings exposing portions of the metallization pattern 146. The patterning of the dielectric layer 148 may be by an acceptable process, such as a process similar to the multi-exposure patterning process described above with respect to patterning the dielectric layer 132.

Figure 20:
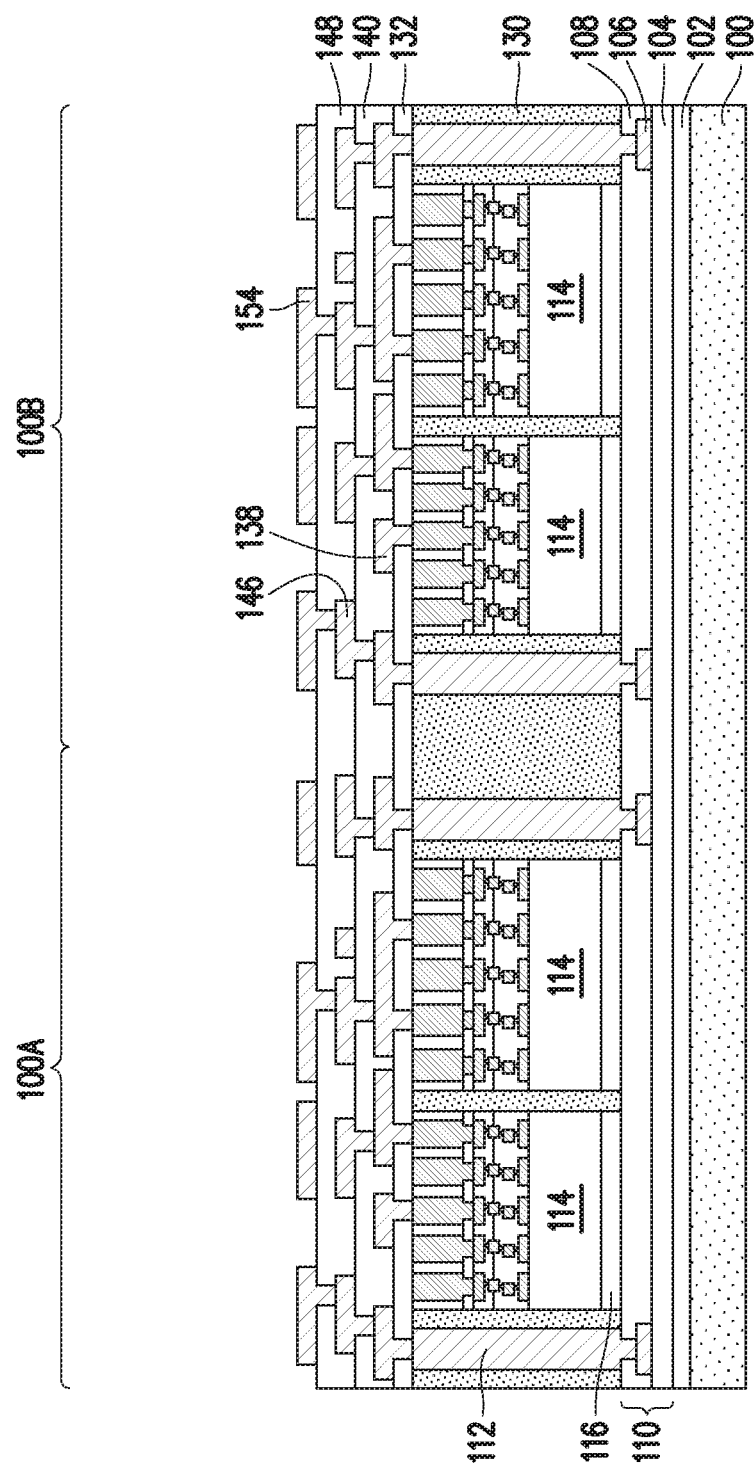

In FIG. 20, metallization pattern 154 with vias is formed on the dielectric layer 148. The metallization pattern 154 may be made of a similar material and formed using a similar process as the metallization pattern 138. For example, a seed layer may be deposited, a photo resist may be deposited on the seed layer, a multi-exposure lithography process as described above may be applied to the photo resist to define openings exposing the seed layer, a plating process may be performed to plate a conductive material on the exposed portions of the seed layer, and the photo resist and portions of the seed layer on which the conductive material is not formed are removed. The remaining portions of the seed layer and conductive material form the metallization pattern 154 and vias. The vias are formed in openings through the dielectric layer 148 to, e.g., portions of the metallization pattern 146.

Figure 21:
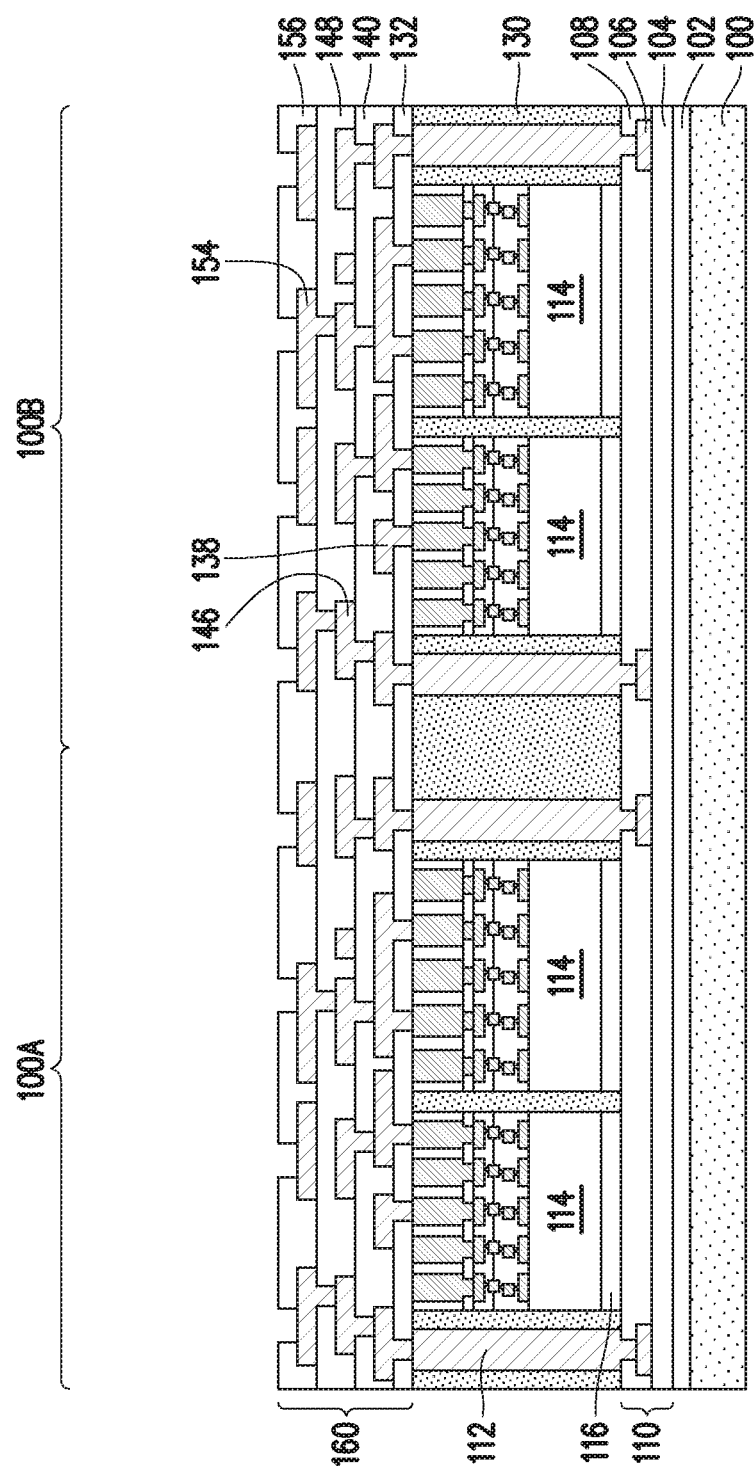

In FIG. 21, the dielectric layer 156 is deposited on the metallization pattern 154 and the dielectric layer 148. The dielectric layer 156 may be made of a similar material and deposited using a similar process as the dielectric layer 132. After the dielectric layer 156 is deposited, it may be patterned to form openings exposing portions of the metallization pattern 154. The patterning of the dielectric layer 156 may be by an acceptable process, such as a process similar to the multi-exposure patterning process described above with respect to patterning the dielectric layer 132.

The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Although the RDL routing design described herein is discussed with respect to the front-side redistribution structure 160, the teachings of the RDL routing process may also be applied to the back-side redistribution structure 110.

Figure 22:
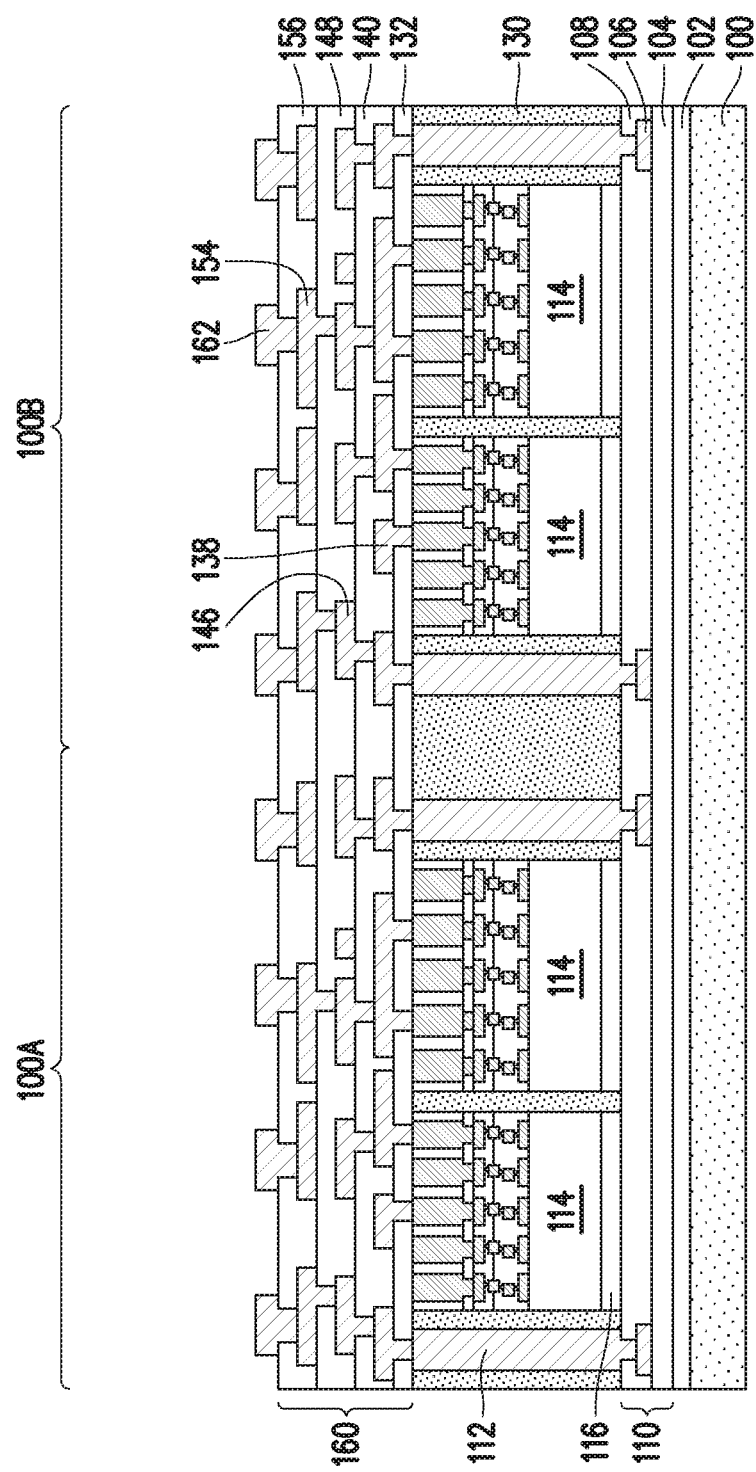

In FIG. 22, pads 162 are formed on an exterior side of the front-side redistribution structure 160. The pads 162 are used to couple to conductive connectors 166 (see FIG. 23) and may be referred to as under bump metallurgies (UBMs) 162. In the illustrated embodiment, the pads 162 are formed through openings through the dielectric layer 156 to the metallization pattern 154. The pads 162 may be made of a similar material and formed using a similar process as the metallization pattern 138. For example, a seed layer may be deposited, a photo resist may be deposited on the seed layer, a multi-exposure lithography process as described above may be applied to the photo resist to define openings exposing the seed layer, a plating process may be performed to plate a conductive material on the exposed portions of the seed layer, and the photo resist and portions of the seed layer on which the conductive material is not formed are removed. The remaining portions of the seed layer and conductive material form the pads 162.

Figure 23:
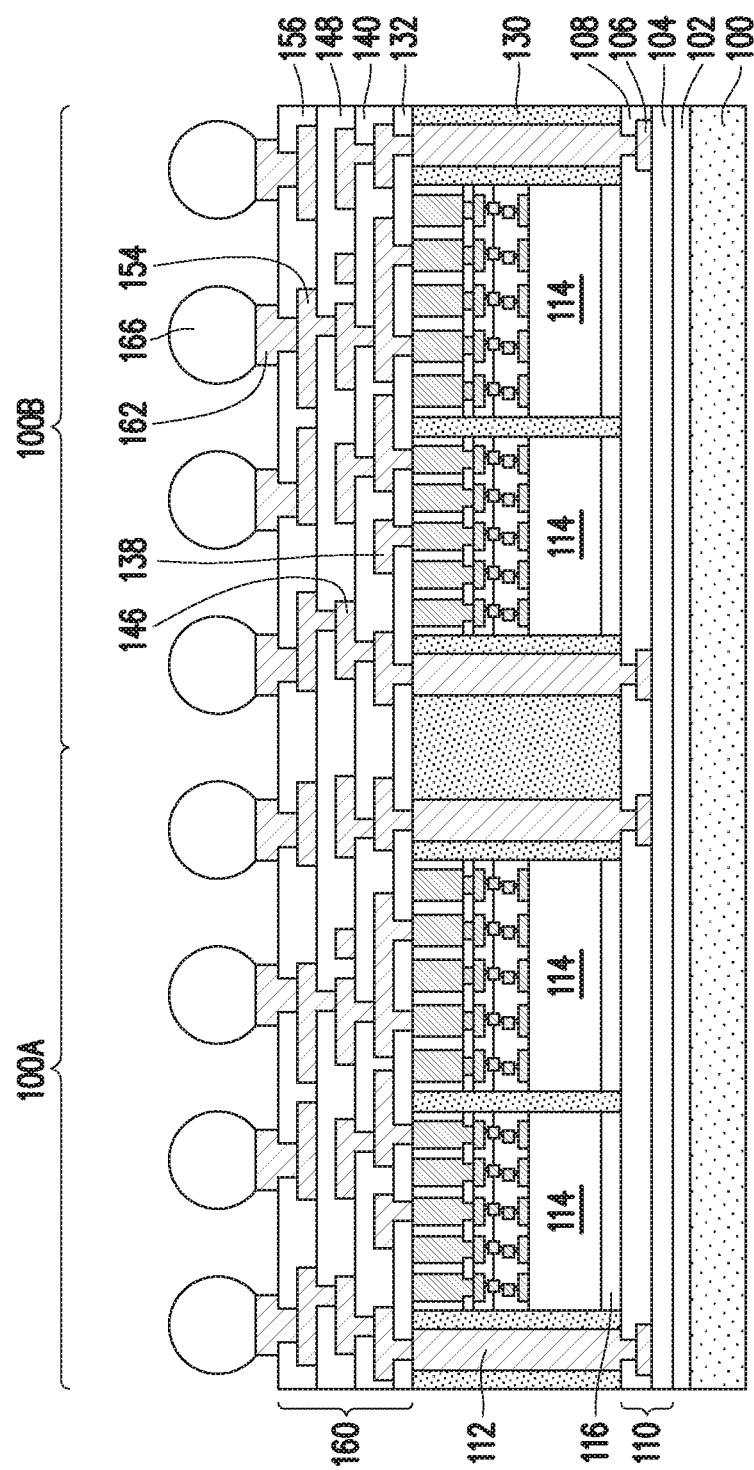

In FIG. 23, conductive connectors 166 are formed on the pads 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 24:
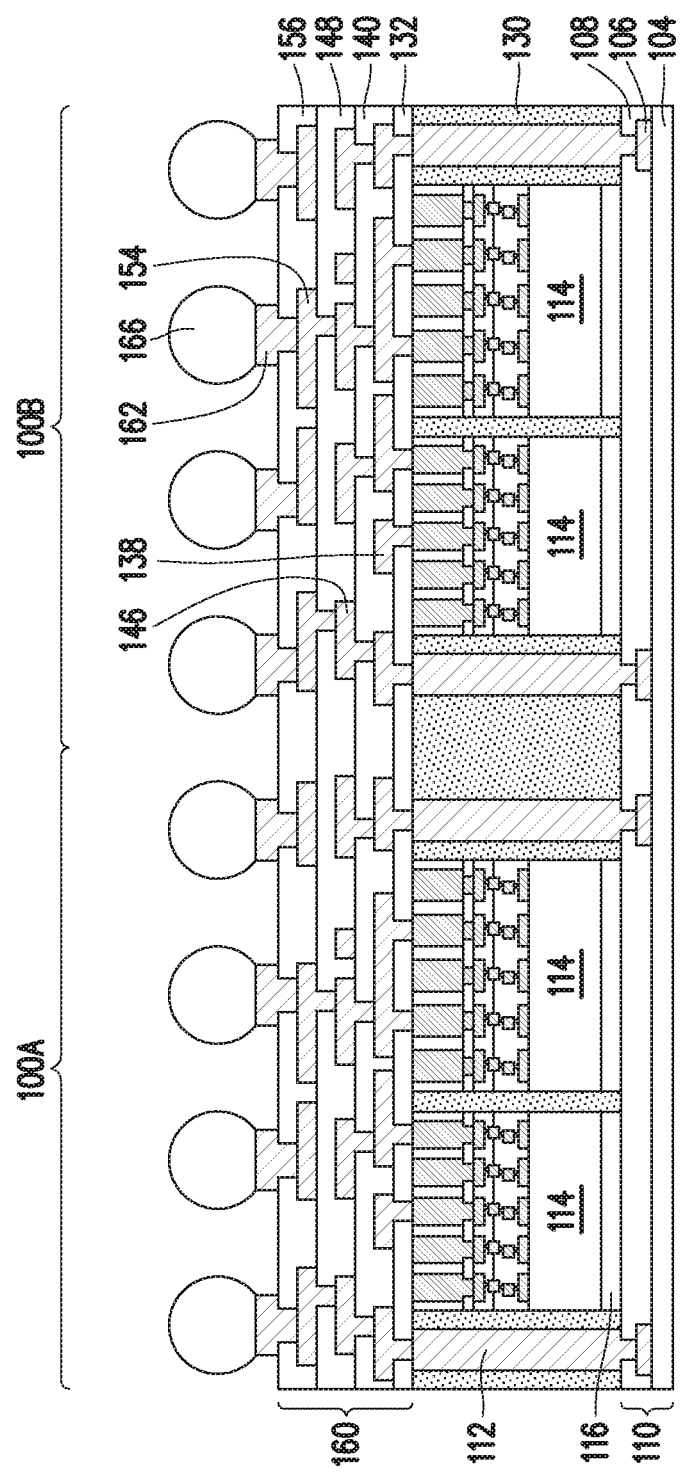

In FIG. 24, a carrier substrate de-bonding is performed to detach (de-bond) the carrier substrate 100 from the back-side redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

Figure 25:
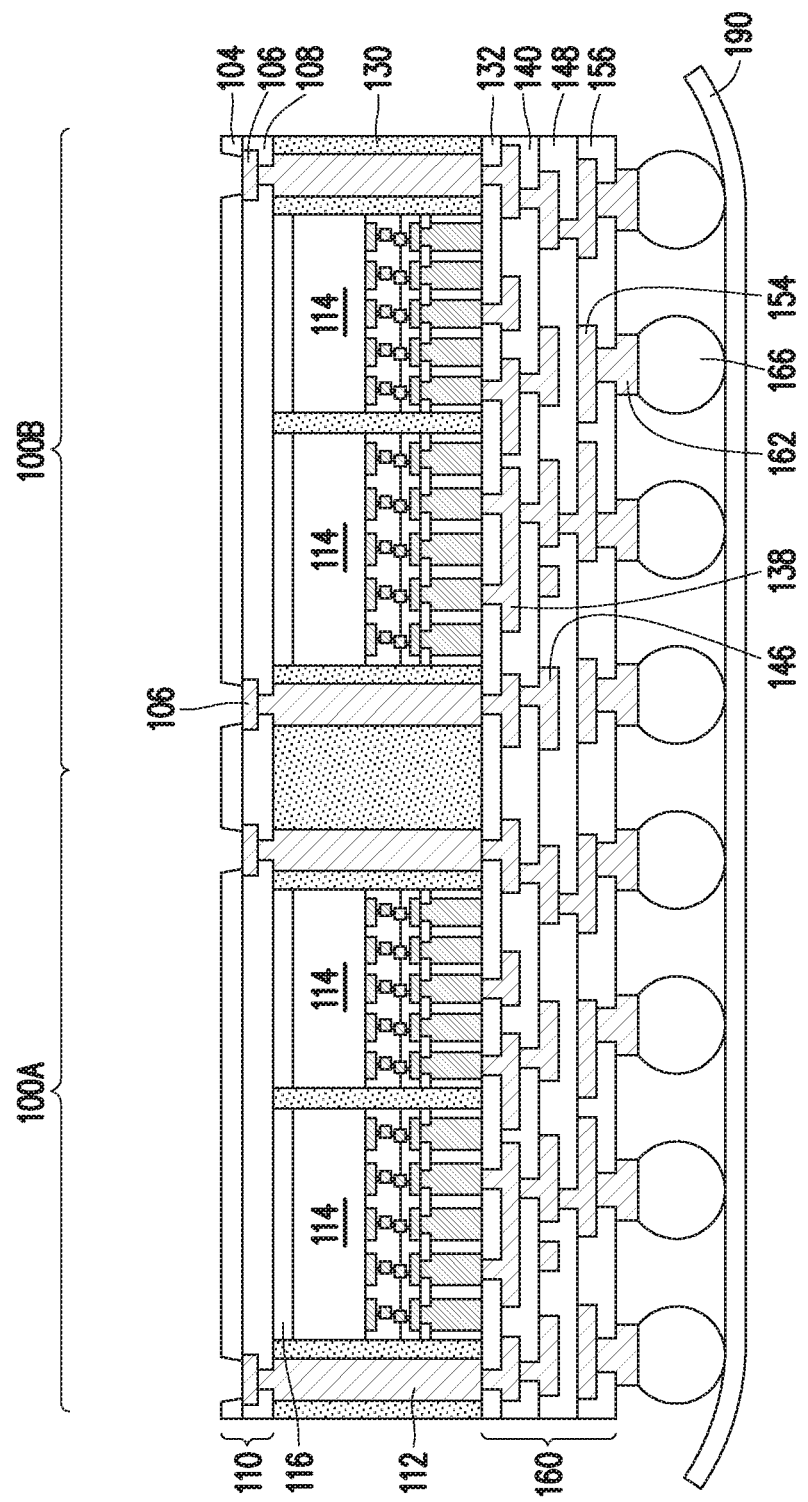

As further illustrated in FIG. 25, openings are formed through the dielectric layer 104 to expose portions of the metallization pattern 106. The openings may be formed, for example, using laser drilling, etching, or the like.

Figure 26:
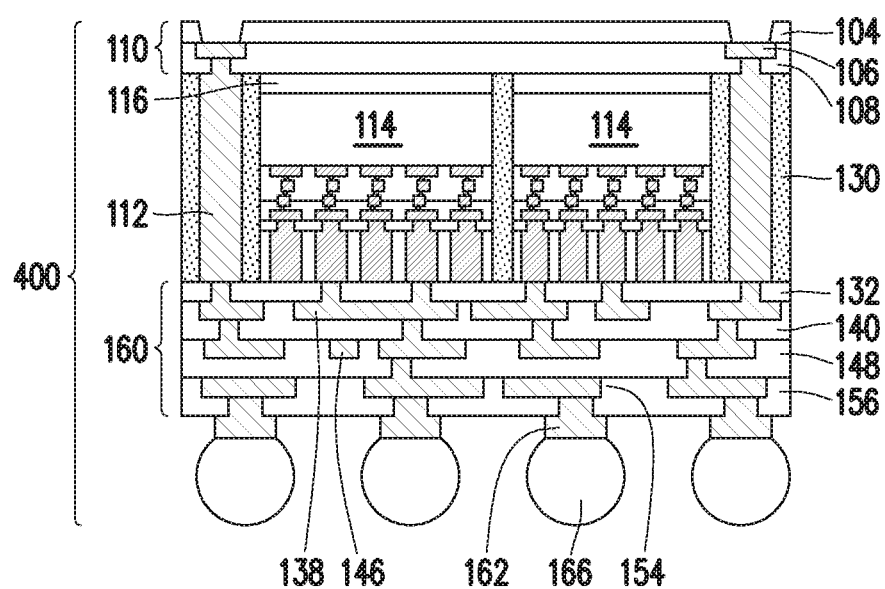

In FIG. 26, a singulation process is performed by sawing 184 along scribe line regions e.g., between adjacent regions 600 and 602. The sawing 184 singulates the first package region 600 from the second package region 602.

FIG. 26 illustrates a resulting, singulated package 400, which may be from one of the first package region 600 or the second package region 602. The package 400 may also be referred to as an integrated fan-out (InFO) package 200.

Figure 27:
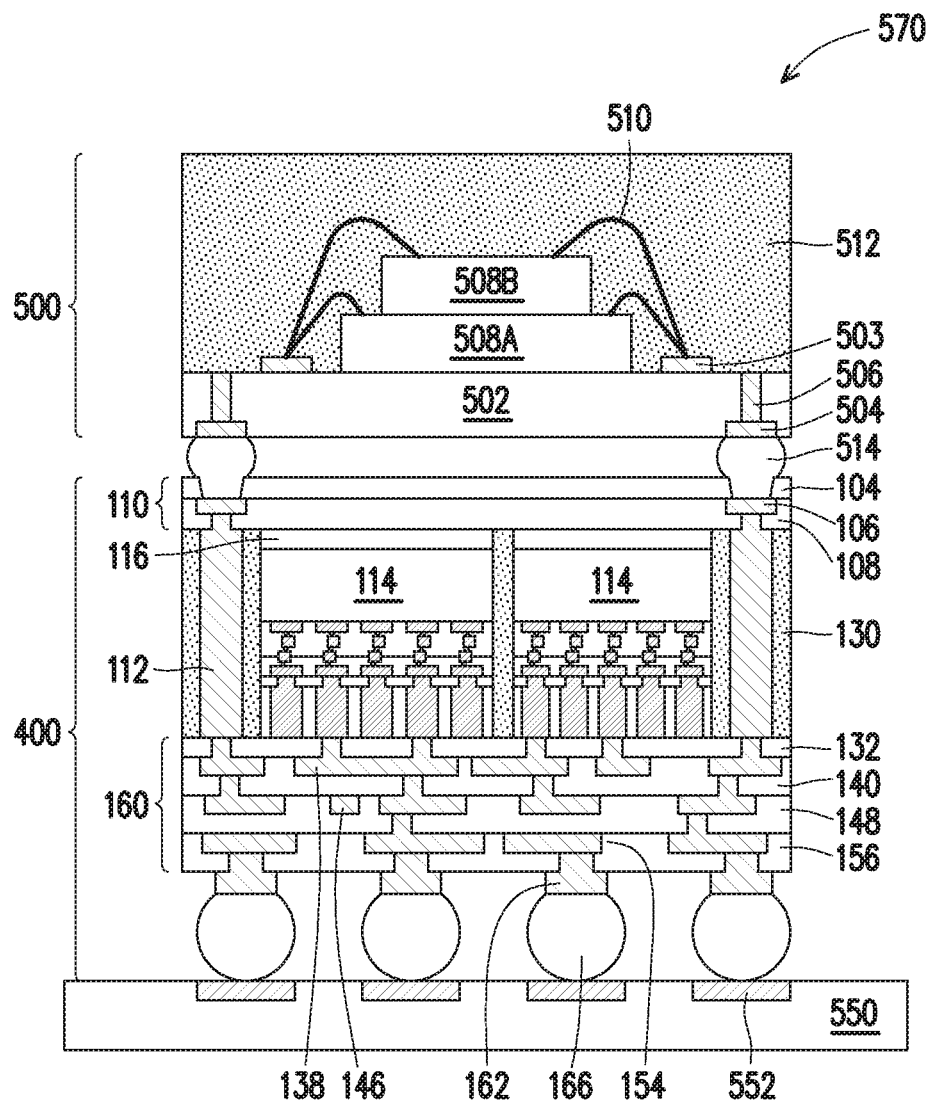

FIG. 27 illustrates a package structure 570 including the package 400 (may be referred to as a first package 400), a second package 500, and a substrate 550. The second package 500 includes a substrate 502 and one or more stacked dies 508 (508A and 508B) coupled to the substrate 502. The substrate 502 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 502 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 502 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 502.

The substrate 502 may include active and passive devices. As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The substrate 502 may also include metallization layers (not shown) and through vias 506. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 502 is substantially free of active and passive devices.

The substrate 502 may have bond pads 503 on a first side the substrate 502 to couple to the stacked dies 508, and bond pads 504 on a second side of the substrate 502, the second side being opposite the first side of the substrate 502, to couple to the conductive connectors 514. In some embodiments, the bond pads 503 and 504 are formed by forming recesses (not shown) into dielectric layers (not shown) on the first and second sides of the substrate 502. The recesses may be formed to allow the bond pads 503 and 504 to be embedded into the dielectric layers. In other embodiments, the recesses are omitted as the bond pads 503 and 504 may be formed on the dielectric layer. In some embodiments, the bond pads 503 and 504 include a thin seed layer (not shown) made of copper, titanium, nickel, gold, palladium, the like, or a combination thereof. The conductive material of the bond pads 503 and 504 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 503 and 504 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 503 and 504. Any suitable materials or layers of material that may be used for the UBMs 503 and 504 are fully intended to be included within the scope of the current application. In some embodiments, the through vias 506 extend through the substrate 502 and couple at least one bond pad 503 to at least one bond pad 504.

In the illustrated embodiment, the stacked dies 508 are coupled to the substrate 502 by wire bonds 510, although other connections may be used, such as conductive bumps. In an embodiment, the stacked dies 508 are stacked memory dies. For example, the stacked memory dies 508 may include low-power (LP) double data rate (DDR) memory modules, such as LPDDR1, LPDDR2, LPDDR3, LPDDR4, or the like memory modules.

In some embodiments, the stacked dies 508 and the wire bonds 510 may be encapsulated by a molding material 512. The molding material 512 may be molded on the stacked dies 508 and the wire bonds 510, for example, using compression molding. In some embodiments, the molding material 512 is a molding compound, a polymer, an epoxy, silicon oxide filler material, the like, or a combination thereof. A curing step may be performed to cure the molding material 512, wherein the curing may be a thermal curing, a UV curing, the like, or a combination thereof.

In some embodiments, the stacked dies 508 and the wire bonds 510 are buried in the molding material 512, and after the curing of the molding material 512, a planarization step, such as a grinding, is performed to remove excess portions of the molding material 512 and provide a substantially planar surface for the second packages 500.

After the second packages 500 are formed, the packages 500 are bonded to the first packages 400 by way of conductive connectors 514, the bond pads 504, and the metallization pattern 106. In some embodiments, the stacked memory dies 508 may be coupled to the integrated circuit dies 114 through the wire bonds 310, the bond pads 503 and 504, through vias 506, the conductive connectors 514, and the through vias 112.

The conductive connectors 514 may be similar to the conductive connectors 166 described above and the description is not repeated herein, although the conductive connectors 514 and 166 need not be the same. In some embodiments, before bonding the conductive connectors 514, the conductive connectors 514 are coated with a flux (not shown), such as a no-clean flux. The conductive connectors 514 may be dipped in the flux or the flux may be jetted onto the conductive connectors 514. In another embodiment, the flux may be applied to the surfaces of the metallization patterns 106.

In some embodiments, the conductive connectors 514 may have an epoxy flux (not shown) formed thereon before they are reflowed with at least some of the epoxy portion of the epoxy flux remaining after the second package 500 is attached to the first package 400. This remaining epoxy portion may act as an underfill to reduce stress and protect the joints resulting from the reflowing the conductive connectors 514. In some embodiments, an underfill (not shown) may be formed between the second package 500 and the first package 400 and surrounding the conductive connectors 514. The underfill may be formed by a capillary flow process after the second package 500 is attached or may be formed by a suitable deposition method before the second package 500 is attached.

The bonding between the second package 500 and the first package 400 may be a solder bonding or a direct metal-to-metal (such as a copper-to-copper or tin-to-tin) bonding. In an embodiment, the second package 500 is bonded to the first package 400 by a reflow process. During this reflow process, the conductive connectors 514 are in contact with the bond pads 504 and the metallization patterns 106 to physically and electrically couple the second package 500 to the first package 400. After the bonding process, an IMC (not shown) may form at the interface of the metallization patterns 106 and the conductive connectors 514 and also at the interface between the conductive connectors 514 and the bond pads 504.

Although the second package 500 is illustrated as being attached to the first package 400 after the first package 400 is singulated from other packages in the wafer, the second package 500 may be attached to the first package 400 prior to singulation in other embodiments. For example, the second package 500 may be attached to the first package 400, and then the first package 400 may be singulated (e.g., as described in FIG. 26).

The semiconductor package 570 includes the packages 400 and 500 being mounted to a package substrate 550. The package 400 is mounted to the package substrate 550 using the conductive connectors 166.

The package substrate 550 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 550 may be a SOI substrate. Generally, an SOI substrate includes a layer of a semiconductor material such as epitaxial silicon, germanium, silicon germanium, SOI, SGOI, or combinations thereof. The package substrate 550 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 550.

The package substrate 550 may include active and passive devices. As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 550 may also include metallization layers and vias (not shown) and bond pads 552 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 550 is substantially free of active and passive devices.

In some embodiments, the conductive connectors 166 can be reflowed to attach the package 400 to the bond pads 552. The conductive connectors 166 electrically and/or physically couple the package substrate 550, including metallization layers in the package substrate 550, to the first package 400.

The conductive connectors 166 may have an epoxy flux (not shown) formed thereon before they are reflowed with at least some of the epoxy portion of the epoxy flux remaining after the package 400 is attached to the package substrate 550. This remaining epoxy portion may act as an underfill to reduce stress and protect the joints resulting from the reflowing the conductive connectors 166. In some embodiments, an underfill (not shown) may be formed between the first package 400 and the package substrate 550 and surrounding the conductive connectors 166. The underfill may be formed by a capillary flow process after the package 400 is attached or may be formed by a suitable deposition method before the package 400 is attached.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Various embodiments use a stitching lithography process to stitch together different patterns defined by different photo mask reticles across different patterning regions. By using stitching lithography, field integration size is no longer limited by exposure field size (e.g., the size of each photo lens). For example, the size of a pattern in a layer can be enlarged by stitching different patterns of masks within different stitching regions. Further using gray tone patterns and a low NA stepper could increase tolerance at the stitching region and reduce manufacturing defects at the stitching region.

In an embodiment, a device includes a molding compound encapsulating a first integrated circuit die and a second integrated circuit die; a dielectric layer over the molding compound, the first integrated circuit die, and the second integrated circuit die; and a metallization pattern over the dielectric layer and electrically connecting the first integrated circuit die to the second integrated circuit die, wherein the metallization pattern comprises a plurality of conductive lines, and wherein each of the plurality of conductive lines: extends continuously from a first region of the metallization pattern through a second region of the metallization pattern to a third region of the metallization pattern; and has a same type of manufacturing anomaly in the second region of the metallization pattern. In an embodiment, a width of each of the plurality of conductive lines increases in the second region of the metallization pattern compared to the first region of the metallization pattern and the third region of the metallization pattern. In an embodiment, a width of each of the plurality of conductive lines decreases in the second region of the metallization pattern compared to the first region of the metallization pattern and the third region of the metallization pattern. In an embodiment, sidewalls of each of the plurality of conductive lines are misaligned in the second region of the metallization pattern. In an embodiment, the second region of the metallization pattern is disposed between a first alignment mark and a second alignment mark. In an embodiment, the device further includes a third alignment mark and a fourth alignment mark, wherein the metallization pattern comprises a second plurality of conductive lines between the third alignment mark and the fourth alignment mark, and wherein a distance between the first alignment mark and the third alignment mark is equal to a distance between the second alignment mark and the fourth alignment mark. In an embodiment, the metallization pattern comprises a third plurality of conductive lines between the first alignment mark and the third alignment mark.

In an embodiment, a method includes encapsulating a first integrated circuit die and a second integrated circuit die in a molding compound; depositing a seed layer over the first integrated circuit die, the second integrated circuit die, and the molding compound; depositing a photo resist over the seed layer; performing a first exposure process on a first patterning region of the photo resist to define a first exposed region; after performing the first exposure process, performing a second exposure process on a second patterning region of the photo resist to define a second exposed region, wherein the first patterning region and the second patterning region overlap in a stitching region; developing the photo resist to define a first opening extending from the first patterning region through the stitching region to the second patterning region; plating a conductive material in the first opening, wherein the conductive material electrically connects the first integrated circuit die and the second integrated circuit die; and removing the photo resist. In an embodiment, a shape of the first exposed region is triangular in the stitching region. In an embodiment, a shape of the second exposed region is triangular in the stitching region. In an embodiment, performing the first exposure process comprises decreasing an exposure intensity applied by the first exposure process in the stitching region, wherein the exposure intensity applied by the first exposure process is decreased in a direction towards the second patterning region. In an embodiment, the exposure intensity applied by the first exposure process is continuously decreased in a direction towards the second patterning region. In an embodiment, the exposure intensity applied by the first exposure process is decreased at discrete intervals in a direction towards the second patterning region. In an embodiment, a cumulative exposure intensity resulting from the first exposure process and the second exposure process throughout the stitching region is no more than 120%. In an embodiment, a size of the first patterning region corresponds to a size of a photomask reticle used during the first exposure process. In an embodiment, performing the first exposure process comprises using a lithography stepper tool having a numerical aperture (NA) less than 0.2.

In an embodiment, a method includes depositing a photo resist over a first die, a second die, and a molding compound, wherein the molding compound is disposed around the first die and the second die; performing a first exposure process on a first patterning region of the photo resist using a first photomask reticle; after performing the first exposure process, performing a second exposure process on a second patterning region of the photo resist using a second photomask reticle, wherein the first patterning region and the second patterning region overlap in a stitching region, wherein performing the first exposure process comprises placing a first triangular opening of the first photomask reticle directly over the stitching region, and wherein performing the second exposure process comprises placing a second triangular opening of the second photomask reticle directly over the stitching region; developing the photo resist to define a third opening in the photo resist, wherein the third opening extends from the first patterning region through the stitching region to the second patterning region; and plating a conductive material in the third opening, wherein the conductive material electrically connects the first die to the second die. In an embodiment, performing the first exposure process comprises: placing a side of the first triangular opening at a first edge of the stitching region; placing a vertex of the first triangular opening at a second edge of the stitching region; placing a side of the second triangular opening at the second edge of the stitching region; and placing a vertex of the second triangular opening at the first edge of the stitching region. In an embodiment, the method further includes using a first alignment mark to align the first photomask reticle with a layer underlying the photo resist; and using an overlay mark to align the second photomask reticle with a pattern defined by the first photomask reticle. In an embodiment, the first alignment mark and the overlay mark overlap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    encapsulating a first integrated circuit die and a second integrated circuit die in a molding compound;
    depositing a seed layer over the first integrated circuit die, the second integrated circuit die, and the molding compound;
    depositing a photo resist over the seed layer;
    performing a first exposure process on a first patterning region of the photo resist to define a first exposed region, wherein performing the first exposure process comprises decreasing an exposure intensity applied by the first exposure process in a stitching region, wherein the exposure intensity applied by the first exposure process is decreased in a direction towards a second patterning region;
    after performing the first exposure process, performing a second exposure process on the second patterning region of the photo resist to define a second exposed region, wherein the first patterning region and the second patterning region overlap in the stitching region;
    developing the photo resist to define a first opening extending from the first patterning region through the stitching region to the second patterning region;
    plating a conductive material in the first opening, wherein the conductive material electrically connects the first integrated circuit die and the second integrated circuit die; and
    removing the photo resist.

2. The method of claim 1, wherein a shape of the first exposed region is triangular in the stitching region.

3. The method of claim 1, wherein a shape of the second exposed region is triangular in the stitching region.

4. The method of claim 1, wherein the exposure intensity applied by the first exposure process is continuously decreased in a direction towards the second patterning region.

5. The method of claim 1, wherein the exposure intensity applied by the first exposure process is decreased at discrete intervals in a direction towards the second patterning region.

6. The method of claim 1, wherein a cumulative exposure intensity resulting from the first exposure process and the second exposure process throughout the stitching region is no more than 120%.

7. The method of claim 1, wherein a size of the first patterning region corresponds to a size of a photomask reticle used during the first exposure process.

8. The method of claim 1, wherein performing the first exposure process comprises using a lithography stepper tool having a numerical aperture (NA) less than 0.2.

9. A method comprising:
depositing a photo resist over a first die, a second die, and a molding compound, wherein the molding compound is disposed around the first die and the second die;
performing a first exposure process on a first patterning region of the photo resist using a first photomask reticle;
after performing the first exposure process, performing a second exposure process on a second patterning region of the photo resist using a second photomask reticle, wherein the first patterning region and the second patterning region overlap in a stitching region, wherein performing the first exposure process comprises placing a first triangular opening of the first photomask reticle directly over the stitching region by placing a side of the first triangular opening at a first edge of the stitching region and placing a vertex of the first triangular opening at a second edge of the stitching region, and wherein performing the second exposure process comprises placing a second triangular opening of the second photomask reticle directly over the stitching region by placing a side of the second triangular opening at the second edge of the stitching region and placing a vertex of the second triangular opening at the first edge of the stitching region;
developing the photo resist to define a third opening in the photo resist, wherein the third opening extends from the first patterning region through the stitching region to the second patterning region; and
plating a conductive material in the third opening, wherein the conductive material electrically connects the first die to the second die.

10. The method of claim 9 further comprising:
using a first alignment mark to align the first photomask reticle with a layer underlying the photo resist; and
using an overlay mark to align the second photomask reticle with a pattern defined by the first photomask reticle.

11. The method of claim 10, wherein the first alignment mark and the overlay mark overlap.

12. A method comprising:
encapsulating a first integrated circuit die and a second integrated circuit die in a molding compound;
depositing a dielectric layer over the molding compound, the first integrated circuit die, and the second integrated circuit die; and
forming a metallization pattern over the dielectric layer;
wherein forming the metallization pattern comprises:
depositing a photoresist over the dielectric layer; and
exposing a first region of the photoresist and a second region of the photoresist using a first reticle, wherein the first region of the photoresist corresponds to a first region of the metallization pattern, wherein the second region of the photoresist corresponds to a second region of the metallization pattern, wherein exposing the first region of the photoresist and the second region of the photoresist comprises reducing an exposure intensity in the second region of the photoresist compared to the first region of the photoresist; and
wherein the metallization pattern comprises a plurality of conductive lines, and wherein each of the plurality of conductive lines:
extends continuously from the first region of the metallization pattern through the second region of the metallization pattern to a third region of the metallization pattern; and
has a same type of manufacturing anomaly in the second region of the metallization pattern.

13. The method of claim 12, wherein a width of each of the plurality of conductive lines is larger in the second region of the metallization pattern compared to the first region of the metallization pattern and the third region of the metallization pattern.

14. The method of claim 12, wherein a width of each of the plurality of conductive lines is smaller in the second region of the metallization pattern compared to the first region of the metallization pattern and the third region of the metallization pattern.

15. The method of claim 12, wherein sidewalls of each of the plurality of conductive lines are misaligned in the second region of the metallization pattern.

16. The method of claim 12, wherein forming the metallization pattern further comprises:
after exposing the first region of the photoresist and the second region of the photoresist, exposing the second region of the photoresist and a third region of the photoresist using a second reticle, wherein the third region of the photoresist corresponds to the third region of the metallization pattern;
developing the photoresist to define openings for the metallization pattern in the photoresist;
filling the openings in the photoresist with a conductive material; and
removing the photoresist.

17. The method of claim 16, wherein exposing the first region of the photoresist and the second region of the photoresist using the first reticle defines a first triangular shape in the second region of the photoresist.

18. The method of claim 17, wherein exposing the second region of the photoresist and the third region of the photoresist using the second reticle defines a second triangular shape in the second region of the photoresist, and wherein the second triangular shape partially overlaps the first triangular shape.

* * * * *